(12) United States Patent
Son et al.

(10) Patent No.: US 8,338,873 B2
(45) Date of Patent: Dec. 25, 2012

(54) SEMICONDUCTOR MEMORY DEVICE INCLUDING ACTIVE PILLARS AND GATE PATTERN

(75) Inventors: Yong-Hoon Son, Yongin-si (KR); Jongwook Lee, Yongin-si (KR); Jung Ho Kim, Suwon-si (KR); SungWoo Hyun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 314 days.

(21) Appl. No.: 12/659,326

(22) Filed: Mar. 4, 2010

(65) Prior Publication Data

US 2010/0224923 A1 Sep. 9, 2010

(30) Foreign Application Priority Data

Mar. 4, 2009 (KR) .................. 10-2009-0018485

(51) Int. Cl.
*H01L 27/108* (2006.01)
*H01L 21/336* (2006.01)

(52) U.S. Cl. ........ 257/302; 257/324; 257/328; 257/331; 257/E29.183; 257/E21.575; 438/268; 438/430; 438/591; 438/637

(58) Field of Classification Search .................. None
See application file for complete search history.

(56) References Cited

U.S. PATENT DOCUMENTS

| | | | |
|---|---|---|---|
| 6,593,624 B2 | 7/2003 | Walker | |
| 6,815,781 B2 | 11/2004 | Vyvoda et al. | |
| 6,841,438 B2 | 1/2005 | Bissey et al. | |
| 6,841,813 B2 | 1/2005 | Walker et al. | |
| 6,881,994 B2 | 4/2005 | Lee et al. | |
| 6,897,514 B2 | 5/2005 | Kouznetsov et al. | |
| 7,285,812 B2 | 10/2007 | Tang et al. | |
| 7,355,230 B2 | 4/2008 | Thies et al. | |
| 7,902,591 B2 * | 3/2011 | Kito et al. | 257/324 |
| 2009/0230459 A1* | 9/2009 | Kito et al. | 257/324 |
| 2010/0006922 A1* | 1/2010 | Matsuoka et al. | 257/324 |

FOREIGN PATENT DOCUMENTS

KR 10-2002-0047228 A 6/2002

\* cited by examiner

*Primary Examiner* — Alonzo Chambliss

(74) *Attorney, Agent, or Firm* — Lee & Morse, P.C.

(57) ABSTRACT

Provided are a semiconductor memory device and a method of manufacturing the same. The semiconductor memory device may include a plurality of active pillars projecting from a semiconductor substrate, a gate pattern disposed on at least a portion of each of the active pillars with a gate insulator interposed therebetween, and a conductive line disposed on each of the active pillars and below the corresponding gate pattern, the conductive line may be insulated from the semiconductor substrate and the gate pattern, wherein each of the active pillars may include a drain region above the corresponding gate pattern, a body region adjacent to the corresponding gate pattern, and a source region that is in contact with the conductive line below the gate pattern.

14 Claims, 29 Drawing Sheets

SEMICONDUCTOR MEMORY DEVICE INCLUDING ACTIVE PILLARS AND GATE PATTERN

BACKGROUND

1. Field

Embodiments are directed to a semiconductor memory device and a method of manufacturing the same.

2. Description of Related Art

Typically, a dynamic random access memory (DRAM) includes one field effect transistor (FET) configured to control read/write operations and one capacitor configured to store charges. An integration density of such DRAMs may be improved by shrinking the FET and by employing a processing technique for securing an effective capacity of the capacitor, e.g., a technique for forming a stacked capacitor or a dip-trench capacitor. However, shrinkage of a transistor may lead to short-channel effect and complexity of a capacitor forming technique may incur high manufacturing costs.

SUMMARY

Embodiments are therefore directed to semiconductor memory devices and methods of manufacturing such semiconductor memory devices, which substantially overcome one or more of the problems due to the limitations and disadvantages of the related art.

It is therefore a feature of an embodiment to provide a semiconductor memory device that may include an active pillar projecting, e.g., perpendicularly, from a semiconductor substrate as an active region and may include a gate pattern contacting at least one side surface of the active pillar with a gate insulator interposed therebetween.

It is therefore a separate feature of an embodiment to provide a semiconductor memory device that may enable extra holes to be accumulated in a body region of an active pillar, e.g., to embody a semiconductor memory device such as, e.g., a capacitorless DRAM device.

It is therefore a separate feature of an embodiment to provide a semiconductor device in which a short channel effect may be suppressed by adjusting vertical thickness of a gate pattern.

It is therefore a separate feature of an embodiment to provide a semiconductor memory device that may include a conductive line for applying a voltage to a source region that is buried below a gate pattern, such that integration density may be improved.

It is therefore a separate feature of an embodiment to provide a method of manufacturing a semiconductor device including forming an active pillar projecting from a semiconductor substrate without using an expensive substrate, e.g., a SOI substrate, such that manufacturing costs may be reduced.

At least one of the above and other features and advantages may be realized by providing a semiconductor memory device, including a plurality of active pillars projecting from a semiconductor substrate, a gate pattern disposed on at least a portion of each of the active pillars with a gate insulator interposed therebetween, and a conductive line disposed on each of the active pillars and below the corresponding gate pattern, the conductive line being insulated from the semiconductor substrate and the gate pattern, wherein each of the active pillars includes a drain region above the corresponding gate pattern, a body region adjacent to the corresponding gate pattern, and a source region that is in contact with the conductive line below the gate pattern.

The gate pattern may at least partially surround a plurality of the active pillars aligned along one direction.

The gate pattern may completely surround at least a cross-sectional portion of the active pillars arranged therein.

The cross-sectional portion may extend along a plane parallel to a plane along which the semiconductor substrate extends.

The gate pattern may have a ladder-like shape including a plurality of openings within which corresponding ones of the active pillars are arranged.

The gate pattern may have a comb-like shape defining a plurality of grooves within which the active pillars are arranged.

The active pillars may have a columnar shape including four vertical sides, and the gate pattern is in contact with no more than three and no less than one vertical side of each of the corresponding ones of the active pillars.

The gate pattern may have a linear shape and may contact one side surface of each of the corresponding ones of the active pillars.

The conductive line may extend in a same direction as the gate pattern.

The conductive line may have a same shape as the gate pattern.

The conductive line and the gate pattern may completely overlap each other along a direction perpendicular to a plane along which the semiconductor substrate extends.

The device may include an insulating pattern contacting a portion of the each of the active pillars free of the gate pattern, wherein at least a portion of each of the insulating pattern and the gate pattern contacting the active pillars may extend along a same plane.

The insulating pattern may extend along a same direction as a direction along which the active pillars extend.

The gate pattern may extend along one direction.

At least one of the above and other features and advantages may be realized by providing a method of manufacturing a semiconductor memory device, including forming a plurality of active pillars on a semiconductor substrate by patterning a third insulating layer, a second insulating layer, and a first insulating layer, patterning the third insulating to expose a sidewall of the active pillars between the third insulating layer and the second insulating layer, forming a gate insulator on the exposed sidewall of each of the active pillars, forming a gate layer at a region where the second insulating layer is removed during patterning, patterning the gate layer to form a gate pattern, forming a conductive line layer, the forming of the conductive line layer including patterning the second insulating layer, and patterning the conductive line layer to form the conductive line below the gate pattern, the conductive line being insulated from the semiconductor substrate and the gate pattern by the first insulating layer and the second insulating layer, respectively, wherein each of the active pillars includes a drain region above the corresponding gate pattern, a body region adjacent to the corresponding gate pattern, and a source region that is in contact with the conductive line below the gate pattern.

The method may include forming an insulating line contacting the first insulating layer and running in one direction.

Forming a plurality of active pillars may include forming an epitaxial semiconductor layer using laser-induced epitaxial growth (LEG), solid phase epitaxy (SPE), metal-induced crystallization (MIC), and/or metal-induced lateral crystallization (MILC).

The source region may correspond to a portion of each of the active pillars adjacent to the second insulating layer, the body region corresponds to a portion of each of the active pillars adjacent to the gate pattern, and the drain region corresponds to a portion of each of the active pillars adjacent to the third insulating layer.

Forming an active pillar may include forming an epitaxial semiconductor layer using selective epitaxial growth (SEG).

Impurities may be implanted by in-situ doping to form the source region, the body region, and the drain region while the epitaxial semiconductor layer is formed using the SEG.

The method may further include forming an insulating pattern through the third insulating layer, the second insulating layer, and the first insulating layer to be in contact with the semiconductor substrate and a sidewall of the active pillar.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
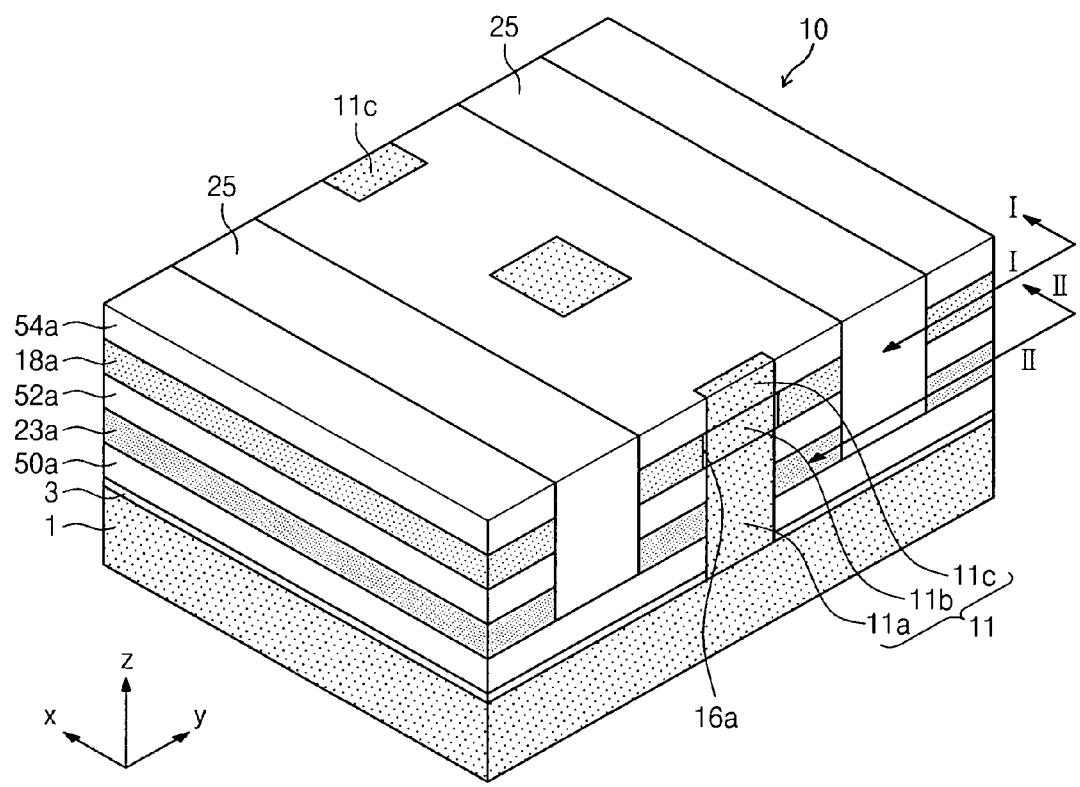
FIG. 1 illustrates a perspective view of an exemplary embodiment of a semiconductor memory device.

Korean Patent Application No. 10-2009-0018485, filed on Mar. 4, 2009, in the Korean Intellectual Property Office, and entitled: "Semiconductor Memory Device and Method of Manufacturing the Same," is incorporated by reference herein in its entirety.

Exemplary embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element, e.g., layer, film, is referred to as being "on" or "above" another element, it can be directly on or above the other element, or intervening elements may also be present. It will also be understood that when an element is referred to as being "below" or "under" another element, it can be directly below or under the other element, or intervening elements may also be present. In addition, it will also be understood that when an element is referred to as being "between" two elements, it can be the only element between the two elements, or one or more intervening elements may also be present. As used herein, the term "and/or" includes any and all combinations of one or more of the associated listed items. Further, as used herein, the singular forms "a," "an" and "the" are intended to include the plural forms as well, unless the context clearly indicates otherwise.

Also, as used herein, terms such as "first," "second," and "third" are used to various regions and/or elements, the regions and/or the elements are not limited to these terms. These terms are used only to tell one region or layer from another region or layer. Therefore, a layer referred to as a first layer in one embodiment may be referred to as a second layer in another embodiment. Further, embodiments described and exemplified herein include complementary embodiments thereof. Like reference numerals refer to like elements throughout the specification.

Figure 2A:
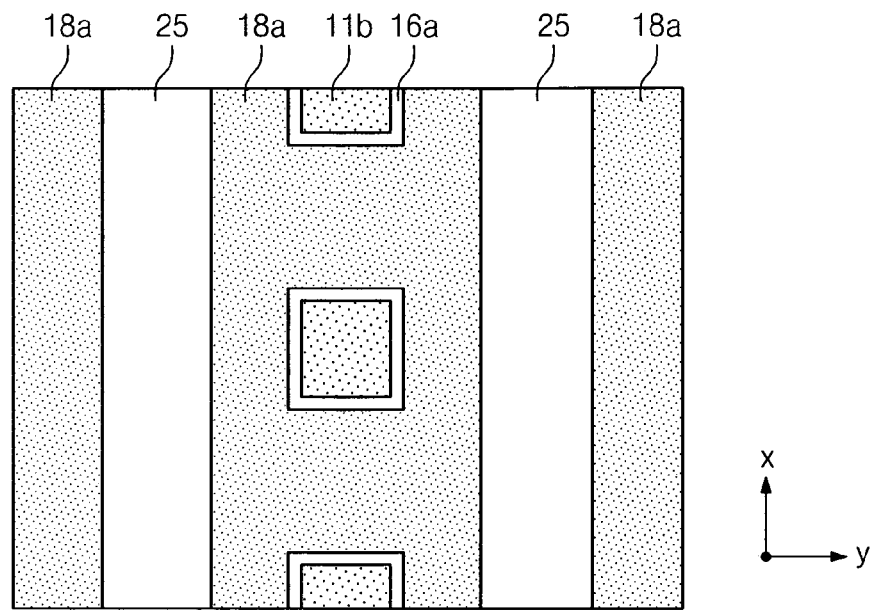
FIG. 2A illustrates a top plan view of the semiconductor memory device of FIG. 1, along the line I-I of FIG. 1.
Figure 2B:
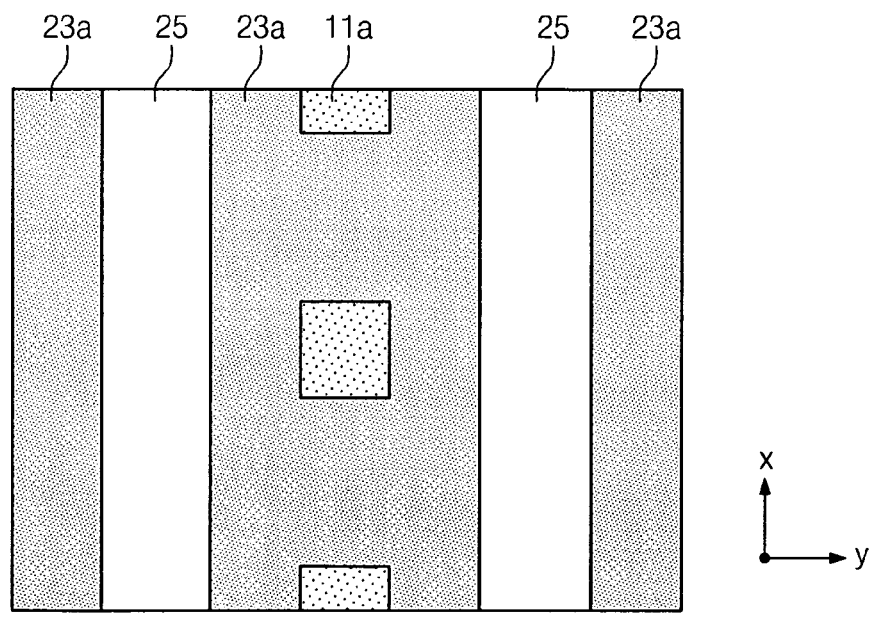
FIG. 2B illustrates a top plan view of the semiconductor memory device of FIG. 1, along line II-II of FIG. 1.

FIG. 1 illustrates a perspective view of an exemplary embodiment of a semiconductor memory device 10. FIG. 2A illustrates a top plan view of the semiconductor memory device 10 of FIG. 1, along the line I-I of FIG. 1. FIG. 2B illustrates a top plan view of the semiconductor memory device 10 of FIG. 1, along line II-II of FIG. 1.

Referring to FIG. 1, the semiconductor memory device 10 may include a semiconductor substrate 1, a peripheral circuit gate insulator 3, a first insulating pattern 50a, a conductive pattern 23a, an insulating pattern 25, a second insulating pattern 52a, a gate pattern 18a, a third insulating pattern 54a, and an active pillar 11.

The active pillar 11 may project from the semiconductor substrate 1. More particularly, the active pillar 11 may project through the peripheral circuit gate insulator 3, the first insulating layer 50a, the conductive pattern 23a, the second insulating layer 52, the gate pattern 18a, and the third insulating layer 54a, which may be sequentially stacked on the semiconductor substrate 1. The active pillar 11 may include a source region 11a, a body region 11b, and a drain region 11c. A well region doped with impurities of a conductivity type opposite to the source region 11a may be formed at the semiconductor substrate 1. The drain region 11c and the source region 11a may be doped with, e.g., N-type impurities, and the body region 11b and the semiconductor substrate 1 may be doped with, e.g., P-type impurities. The well region may be surrounded by at least one of other well regions (not shown) having a different conductivity type to constitute a pocket-well structure or a triple-well structure.

The active pillar 11 may be an epitaxial semiconductor layer, which may have a crystalline structure aligned with a semiconductor crystalline structure of the semiconductor substrate 1. A gate insulator 16a may be disposed between the gate pattern 18a and the active pillar 11. The conductive pattern 23a may serve to apply a voltage to the source region 11a of the active pillar 11.

The insulating pattern 25 may be formed on the first insulating layer 50a and may protrude through one or more layers on the semiconductor substrate 1. More particularly, the insulating pattern 25 may protrude through the third insulating layer 54a, the gate pattern 18a, the second insulating layer 52a, and/or the conductive pattern 23a, and may separate adjacent ones of the third insulating layer 54a, the gate pattern 18a, the second insulating layer 52a, and/or the conductive pattern 23a from adjacent ones of the third insulating layer 54a, the gate pattern 18a, the second insulating layer 52a, and/or the conductive pattern 23a. The insulating pattern 25 may contact the first insulating layer 50a. The insulating pattern 25 may be spaced apart from the active pillar 11. The insulating pattern 25 may extend, e.g., along an x-direction.

As illustrated in FIG. 1, in some embodiments, the semiconductor memory device 10 may include a plurality of the active pillars 11, a plurality of the insulating patterns 25, a plurality of the gate patterns 18a, and a plurality of the conductive patterns 23a. Each of the insulating patterns 25 may separate and insulate respective ones of the gate patterns 18a and/or respective ones of the conductive patterns 23a from each other. Each of the insulating patterns 25 may be spaced apart from the active pillars 11. The conductive patterns 23a and the gate patterns 18a may extend between adjacent ones of the insulating patterns 25, and may include openings corresponding to the active pillars 11 therebetween. The gate patterns 18a, the gate insulator 16a and/or the conductive patterns 23a may least In such embodiments, e.g., each of the gate patterns 18a and the conductive patterns 23a may respectively correspond to respective signal lines of the semiconductor device and/or may have a line type pattern. The insulating patterns 25 may serve, e.g., to separate (or insulate) one wordline (gate pattern 18a) from the wordline (gate pattern 18a) adjacent thereto and/or to separate the conductive patterns 23a from the conductive pattern 23a adjacent thereto.

More particularly, as shown in FIG. 1, each of the active pillars 11 projecting from the semiconductor substrate 1 may be associated with a corresponding one of the gate patterns 18a disposed on a portion, e.g., at least one side surface portion, thereof. The gate insulator 16a may be interposed between each of the corresponding ones of the gate patterns 18a and the active pillars 11. More particularly, referring to FIG. 2A, the gate insulators 16a may have a shape corresponding to the active pillars 11. That is, for each of the active pillars 11, the corresponding gate insulator 16a may completely cover portions of the active pillars 11 on which the corresponding gate pattern 18a may be formed. For example, if the active pillar 11 has a square like cross-sectional shape along the x-y plane, the corresponding gate insulator 16a may have a square-ring like cross-sectional shape along the x-y plane. In the exemplary embodiment of FIGS. 1, 2A, and 2B, the gate pattern 18a, the conductive pattern 23a and/or the gate insulator 16a may completely surround the active pillar 11 along a respective plane, e.g., respective x-y plane.

Each of the active pillars 11 may be in contact with a corresponding one of the conductive patterns 23a. More particularly, a corresponding one of the conductive patterns 23a may be arranged so as to be in contact, e.g., direct contact, with at least one side surface of each of the active pillars 11. The conductive patterns 23a may be arranged below the gate pattern 18a. That is, e.g., the conductive pattern 23a and the gate pattern 18a associated with a respective one of the active pillars 11 may at least partially overlap each other. The conductive patterns 23a and the gate pattern 18a associated with a respective one of the active pillars 11 may substantially have a same general shape and/or size. Each of the conductive patterns 23a may be insulated from the semiconductor substrate 1 and the corresponding gate pattern 18a.

Referring still to FIG. 1, the drain region 11c may be included in the active pillar 11 above the gate pattern 18a, e.g., a level higher than a level at which the gate pattern 18a is formed relative to the semiconductor substrate 1, the body region 11b may be included in the active pillar 11 adjacent to the gate pattern 18a, e.g., same level as the gate pattern 18a relative to the semiconductor substrate 1, and the source region 11a may be included in the active pillar 11 adjacent to the conductive pattern 23a, e.g., same level as the conductive pattern 23a relative to the semiconductor substrate 1.

More particularly, in the exemplary embodiment of the semiconductor memory device 10 illustrated in FIG. 1, the gate pattern 18a has a ladder shape, including portions that surround and contact the body region 11b of the active pillar 11, which extends along one direction, e.g., x-direction (see FIG. 2A). That is, e.g., portions of all side surfaces, e.g., all four vertical side surfaces extending along an x-z and/or y-z plane, of the body region 11b may be surrounded by corresponding portions of the gate pattern 18a to maximize a channel area and increase an amount of current. Further, in the exemplary embodiment of the semiconductor memory device 10 illustrated in FIG. 1, the conductive pattern 23a has a ladder shape, including portions that surround and contact the source region 11a of the active pillar 11, which extends in one direction, e.g., x-direction (see FIG. 2B).

In embodiments in which the conductive pattern 23a is buried below the gate pattern 18a, an integration density may increase and a coupling effect or misalignment with another conductive pattern may be overcome. In addition, because the conductive pattern 23a may be separated from an adjacent conductive pattern 23a by the insulating pattern 25, each transistor may be easily controlled. In addition, because the conductive pattern 23a may be formed of a conductive material, e.g., metal or metal silicide, resistance may be lowered and operating speed of the device may be improved.

When a unit transistor in the semiconductor memory device 10 according to the exemplary embodiment of FIG. 1 operates, holes or electrons may not be released to the semiconductor substrate 1 but may be temporarily accumulated at a center of the body region 11b.

Figure 3:
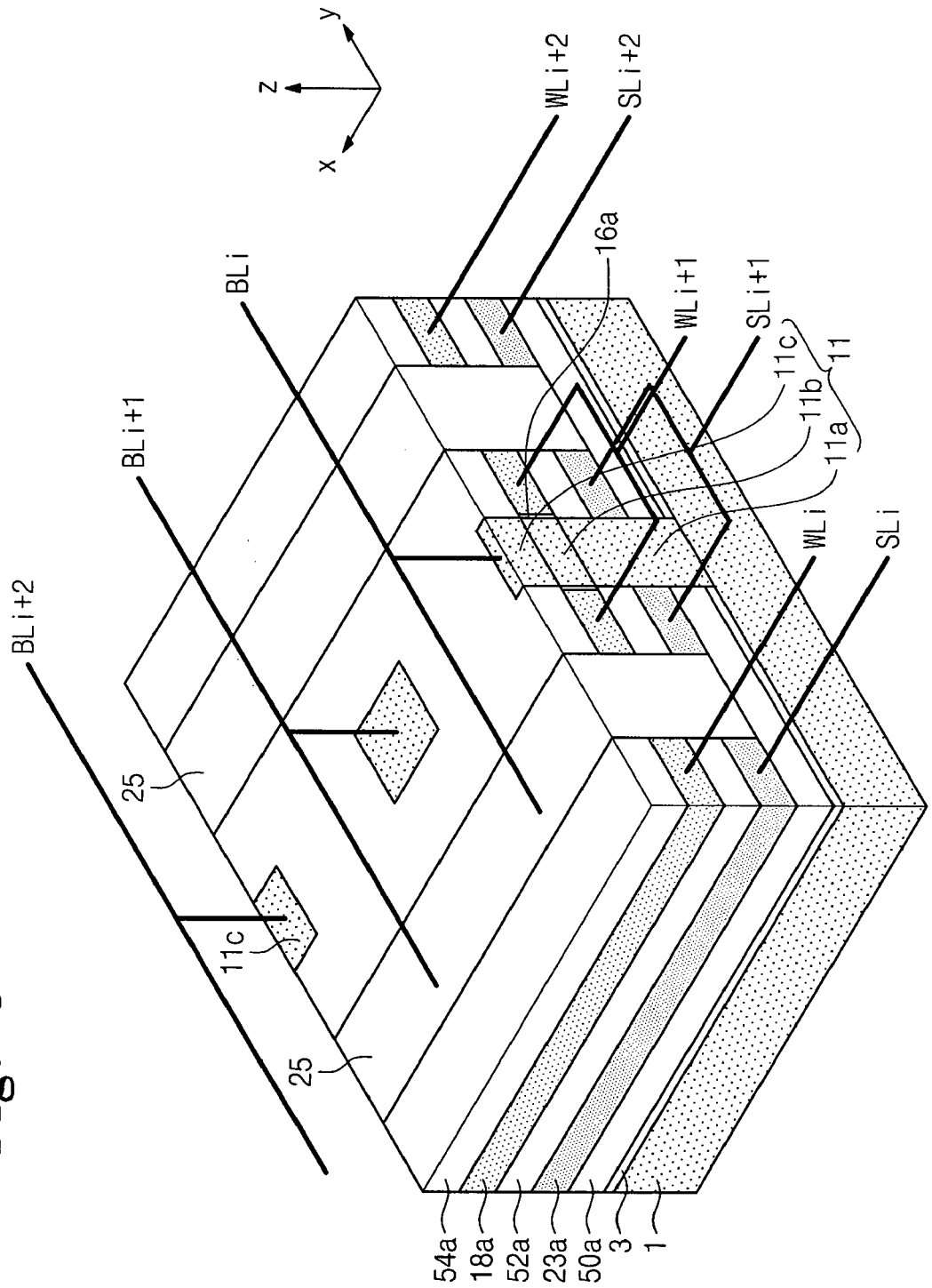
FIG. 3 illustrates a schematic diagram of the semiconductor memory device of FIG. 1 including an exemplary connection scheme.

FIG. 3 illustrates a schematic diagram of the semiconductor memory device 10 of FIG. 1 including an exemplary connection scheme.

Referring to FIG. 3, the drain region 11c may be electrically connected to a bitline BLk (k=i, i+1, i+2, . . . ) extending in a direction, e.g., y-direction, that is perpendicular to a direction, e.g., x-direction, in which the gate pattern 18a extends. Each of the gate patterns 18a may correspond to a wordline WLk (k=i, i+1, i+2, . . . ) extending, e.g., in the same direction, e.g., x-direction, as the gate patterns 18a. Each of the conductive pattern 23a may correspond to a select line SLk (k=i, i+1, i+2, . . . ) or a source line SLk (k=i, i+1, i+2, . . . ) extending, e.g., in the same direction, e.g., x-direction, as the gate patterns 18a.

Figure 4:
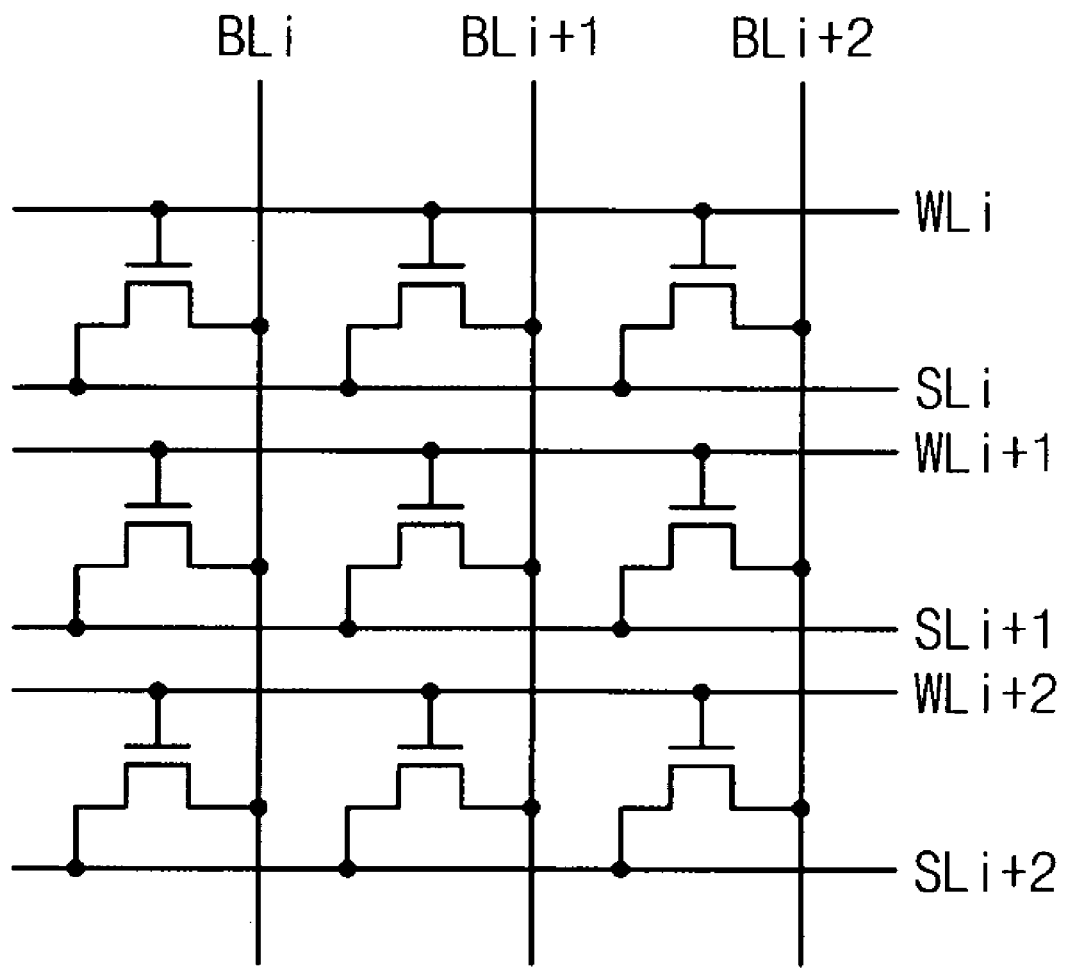
FIG. 4 illustrates an exemplary embodiment of a circuit diagram of the semiconductor memory device shown in FIG. 1.

FIG. 4 illustrates a circuit diagram of an exemplary embodiment of a semiconductor memory device 10 shown in FIG. 1. Exemplary write and read operations of a unit memory cell including one transistor will now be described below in detail with reference to FIG. 4.

During a write operation, data "1" may be written (or stored) by applying a ground voltage to a source line, e.g., SLk (k=i, i+1, i+2, . . . ), applying a positive voltage of a predetermined level (e.g., a voltage of 0.6 volt) to a wordline, e.g., WLk (k=i, i+1, i+2, . . . ), and applying a positive voltage of a predetermined level (e.g., a voltage of 1.5 volt) to a bitline, e.g., BLk (k=i, i+1, i+2, . . . ). During the write operation, data "0" may be written (or stored) by applying a ground voltage to a source line, e.g., SLk (k=i, i+1, i+2, . . . ), applying a negative voltage of a predetermined level (e.g., a voltage of 0.6 volt) to a wordline, e.g., WLk (k=i, i+1, i+2, . . . ), and applying a negative voltage of a predetermined level (e.g., a voltage of −1.5 volt) to a bitline, e.g., BLk (k=i, i+1, i+2, . . . ). A threshold voltage of a transistor decreases when the data "1" is stored and increases when the data "0" is stored.

During a read operation, a voltage of a bitline, e.g., BLk (k=i, i+1, i+2, . . . ), may be detected to read data "0" and data "1" by applying a positive voltage of a predetermined level to a wordline, e.g., WLk (k=i, i+1, i+2, . . . ), and applying a voltage of a predetermined level (e.g., a voltage of 2 volt) to a source line, e.g., SLk (k=i, i+1, i+2, . . . ), of a selected memory cell. That is, a voltage obtained by subtracting a threshold voltage of a transistor from a voltage applied to a source line, e.g., SLk (k=i, i+1, i+2, . . . ), is generated when data "1" or data "0" is stored in a selected transistor. Thus, a bitline voltage of a transistor storing the data "1" becomes higher than that of a transistor storing data "0". Due to detection of the bitline voltage, the data "0" and the data "1" may be read.

FIGS. 5, 6, 7, 8, 9, 10, 11, 12, 13, 14, 15, and 16 illustrate perspective views of stages in an exemplary method of manufacturing the semiconductor memory device 10 of FIG. 1.

Figure 5:
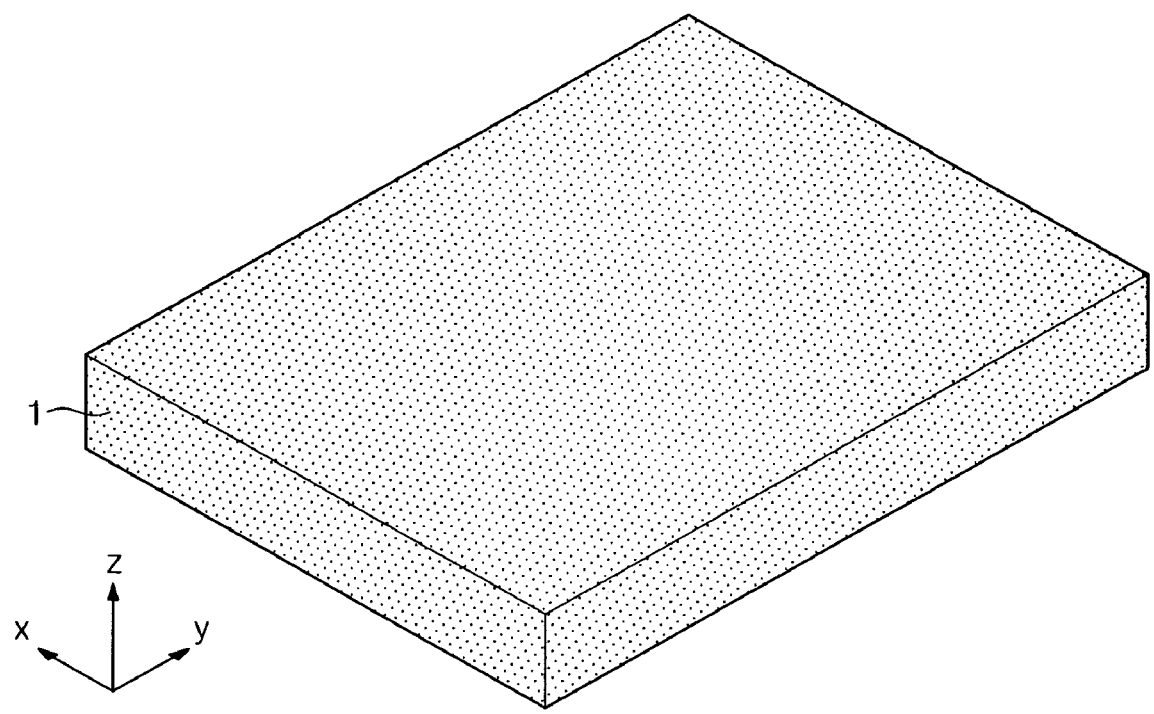
FIGS. 5, 6, 7, 8, 9, 10, 11, 12, 13, 14, 15, and 16 illustrate perspective views of stages in an exemplary method of manufacturing the semiconductor memory device of FIG. 1.

Referring to FIG. 5, the semiconductor substrate 1 may be provided. A well region may be formed by doping, e.g., P-type impurities onto a surface, e.g., an entire surface, of the semiconductor substrate 1. Although not shown, an isolation oxide layer may be formed on the semiconductor substrate 1 in a peripheral circuit region. An isolation oxide layer may not be formed on the semiconductor substrate 1 in a memory cell region.

Figure 6:
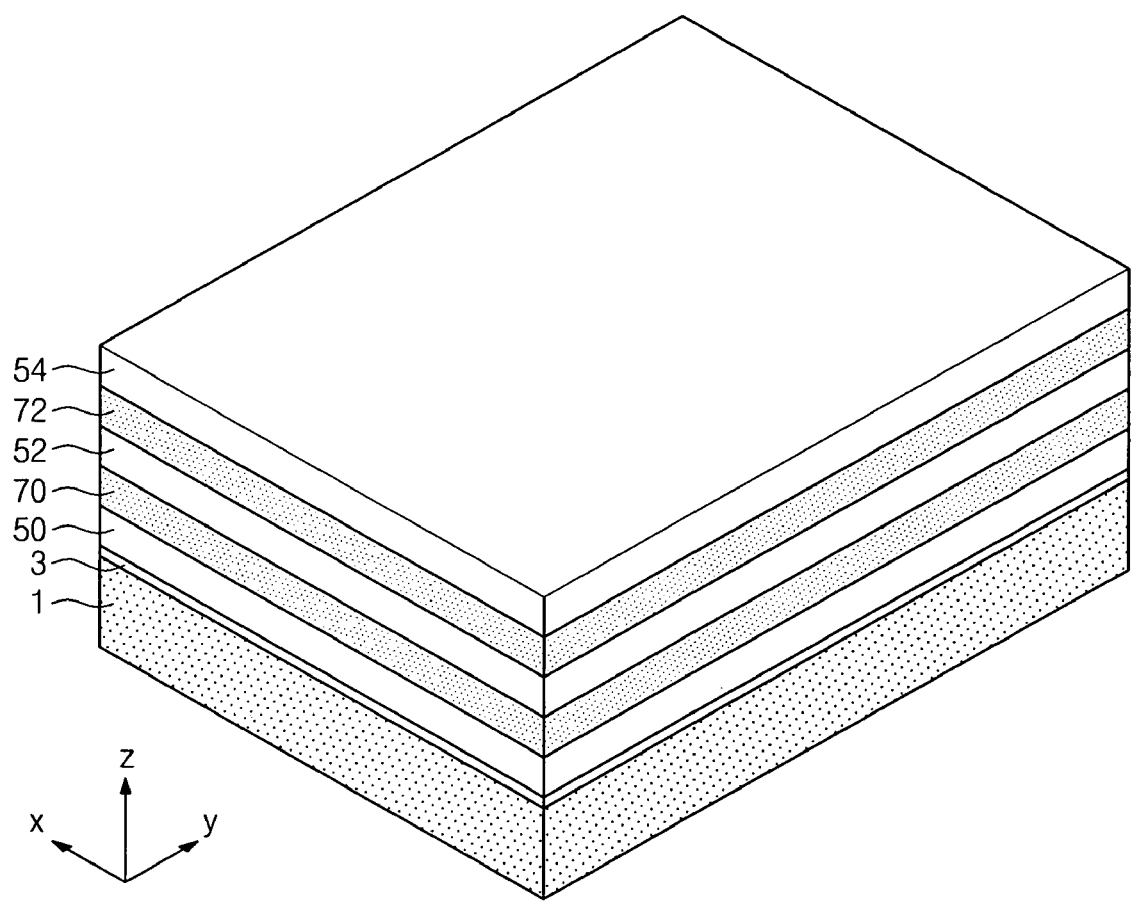

Referring to FIG. 6, the peripheral circuit gate insulator 3 may be formed on the semiconductor substrate 1. The peripheral circuit gate insulator 3 may be provided to form a peripheral circuit transistor. Thus, if only forming a memory cell region, formation of the peripheral circuit gate insulator 3 may be omitted. A first insulating layer 50, a first sacrificial layer 70, a second insulating layer 52, a second sacrificial layer 72, and a third insulating layer 54 may be sequentially stacked on the semiconductor substrate 1. The sacrificial layers 70 and 72 may have an etch selectivity with respect to the insulating layers 50, 52, and 54. If each of the insulating layers 50, 52, and 54 includes, e.g., a silicon oxide-based material, each of the sacrificial layers 70 and 72 may include, e.g., silicon nitride, silicon germanium, or tungsten. Thicknesses of the respective sacrificial layers 70 and 72 may be determined considering thicknesses of the corresponding gate pattern 18a and a conductive pattern 23a (see FIGS. 1, 2A, and 2B), which will be formed in subsequent processes, and a length of a channel.

Figure 7:
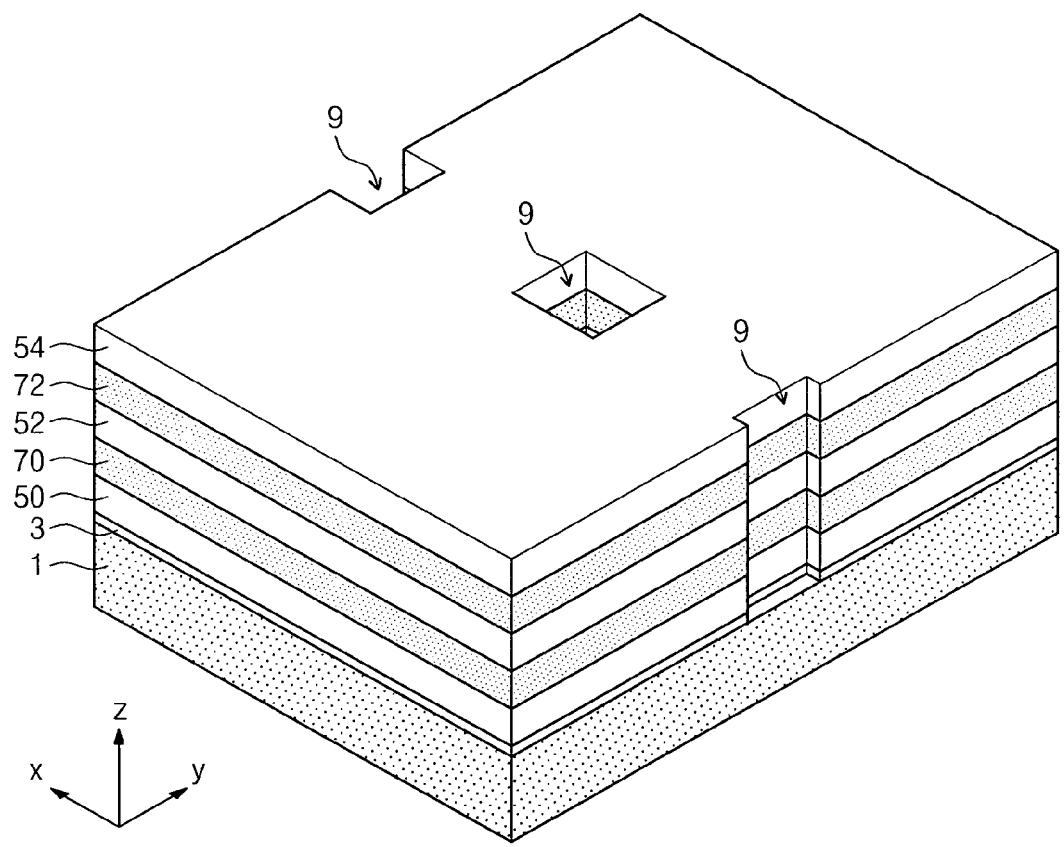

Referring to FIG. 7, the third insulating layer 54, the second sacrificial layer 72, the second insulating layer 52, the first sacrificial layer 70, the first insulating layer 50, and the peripheral circuit gate insulator 3 may be successively patterned to form a pillar hole 9. The pillar hole 9 may expose the semiconductor substrate 1.

Figure 8:
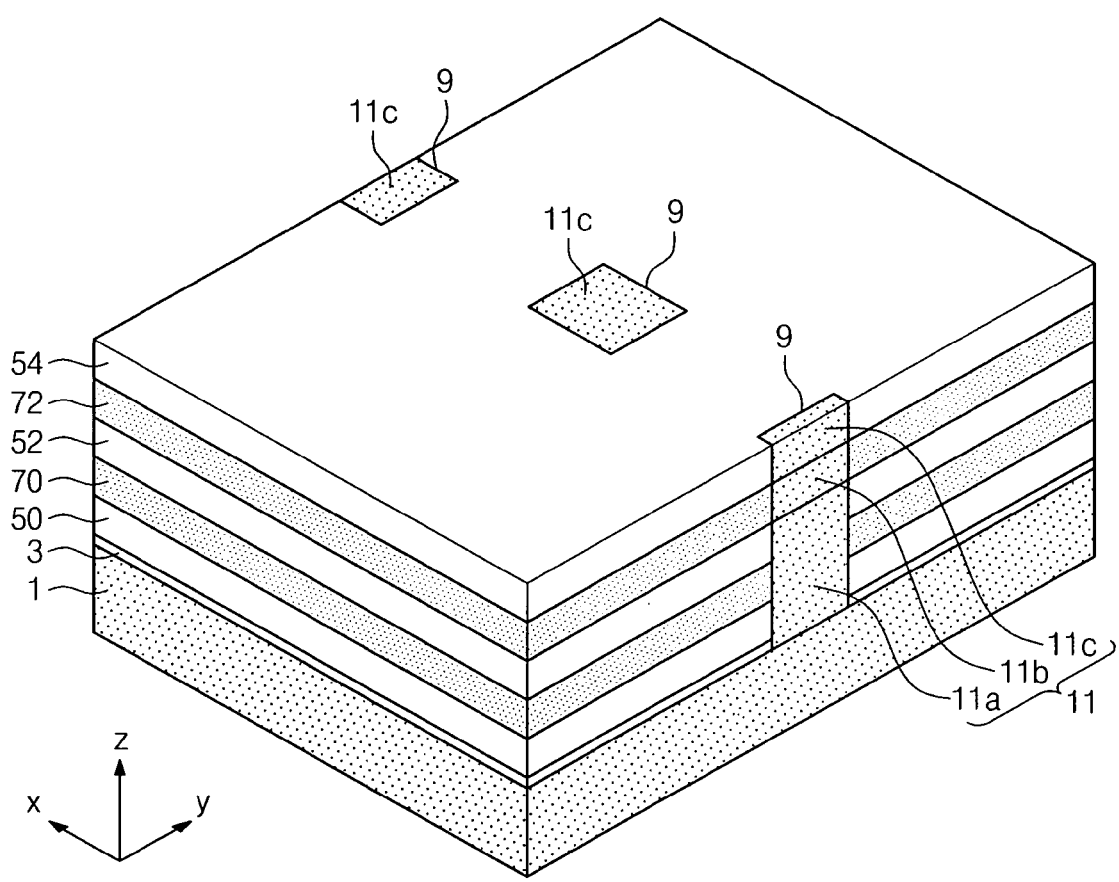

Referring to FIG. 8, the active pillar 11 may be formed in the pillar hole 9. The active pillar 11 may be an epitaxial semiconductor layer. More particularly, in some embodiments, the active pillar 11 may be formed using, e.g., laser-induced epitaxial growth (LEG), solid phase epitaxy (SPE) and/or metal-induced lateral crystallization (MILC), etc. When the epitaxial semiconductor layer is formed by such techniques, an epitaxial semiconductor layer that may be formed on the third insulating layer 54 may be removed using, e.g., chemical mechanical polishing (CMP) or etchback. Following formation of the epitaxial semiconductor layer, the source region 11a, the body region 11b, and the drain region 11c may be formed using, e.g., ion implantation (where impurities are implanted into the active pillar 11) several times.

In some other embodiments, e.g., the active pillar 11 may be an epitaxial semiconductor layer formed using, e.g., selective epitaxial growth (SEG). While the epitaxial semiconductor layer may be formed using SEG, the source region 11a, the body region 11b, and the drain region 11c may be formed using, e.g., an in-situ doping (where impurities are implanted in-situ). The source region 11a and the drain region 11c may be doped with, e.g., N-type impurities, whereas the body region 11b may be doped with, e.g., P-type impurities.

Figure 9:
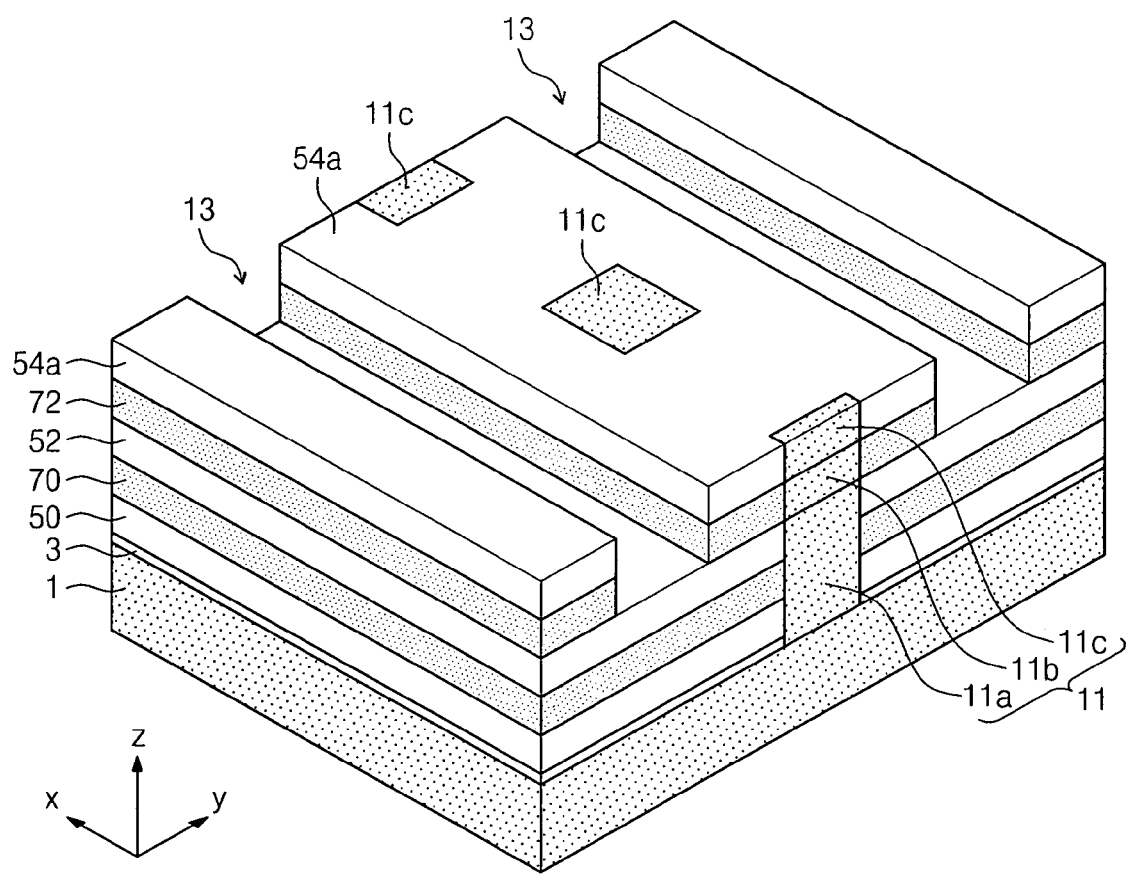

Referring to FIG. 9, at least the third insulating layer 54 may be linearly patterned at a portion thereof spaced apart from the active pillar 11 to form a first groove 13. The first groove 13 may exposes the second sacrificial layer 72. Thus, the third insulating layer 54 may be pattered to form the third insulating pattern 54a. As described above, e.g., the third insulating pattern 54a may surround the active pillar 11 and may extend along one direction, e.g., x-direction (see FIGS. 1, 2A and 2B).

Figure 10:
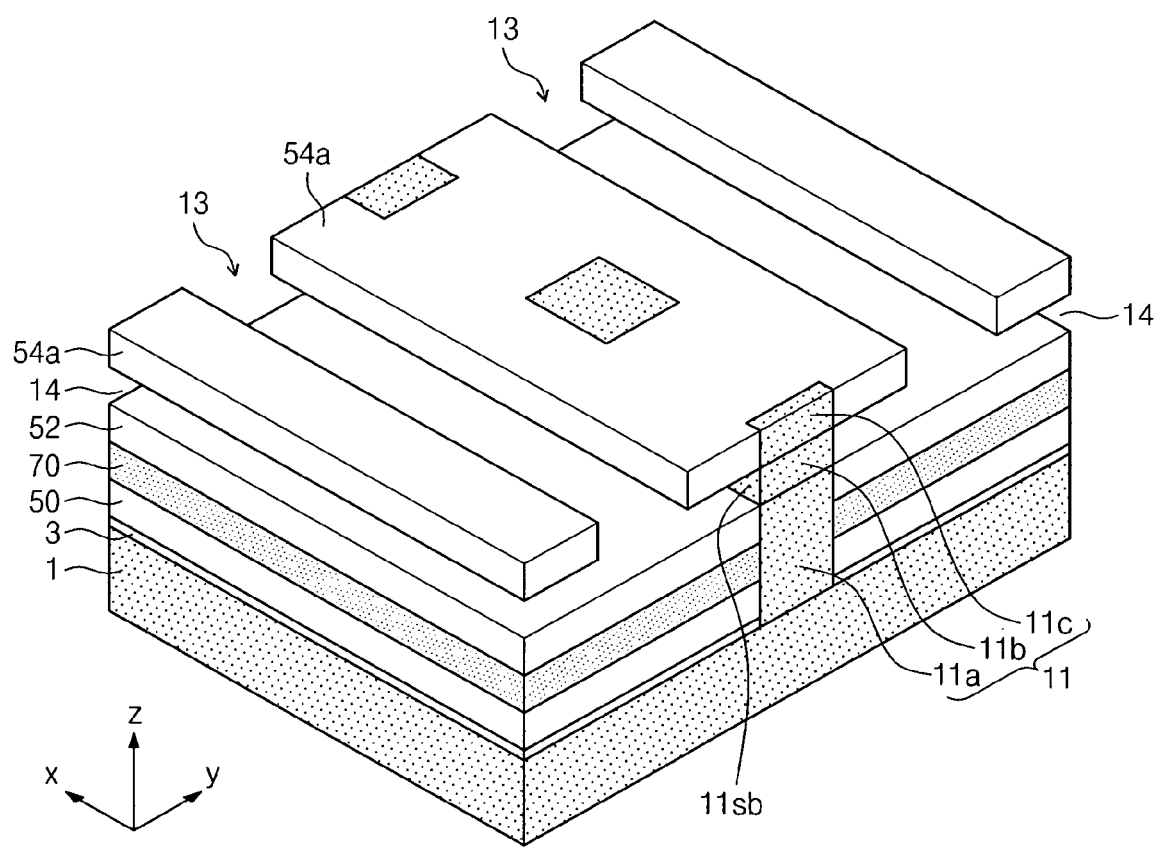

Referring to FIG. 10, the second sacrificial layer 72 exposed by the first groove 13 may be removed. The second sacrificial layer 72 may be removed using, e.g., a wet etching process. More particularly, the second sacrificial layer 72 may be removed using a wet etching process employing an etchant having, e.g., an etch selectivity with respect to the insulating layers 54 and 52. For example, if each of the insulating layers 54 and 52 includes a silicon oxide-based material and the second sacrificial layer 72 includes a silicon nitride-based material, the sacrificial layer 72 may be removed using phosphoric acid. If, e.g., each of the insulating layers 54 and 52 includes a silicon oxide-based material and the second sacrificial layer 72 includes tungsten or silicon germanium, the sacrificial layer 72 may be removed using a mixture of ammonium hydroxide, hydrogen peroxide, and water. Due to removal of the second sacrificial layer 72, a sidewall 11sb of the body region 11b among the active pillar 11 may be exposed to a region 14 where the sacrificial layer 72 is removed.

Figure 11:
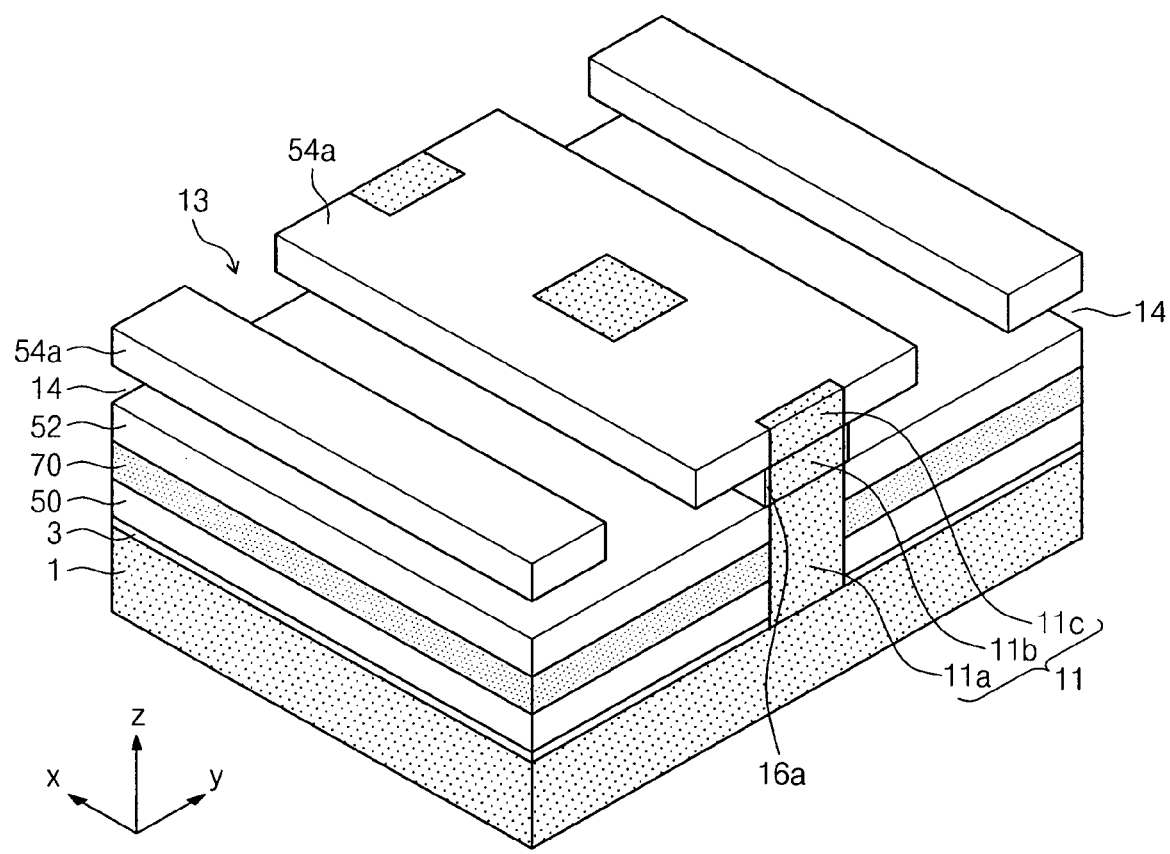

Referring to FIG. 11, the semiconductor substrate 1 including the exposed sidewall 11sb of the body region 11b may be loaded into a chamber in an oxygen-containing ambient to form the gate insulator 16a on the exposed sidewall 11sb of the body region 11b. The gate insulator 16a may include, e.g., thermal oxide.

Figure 12:
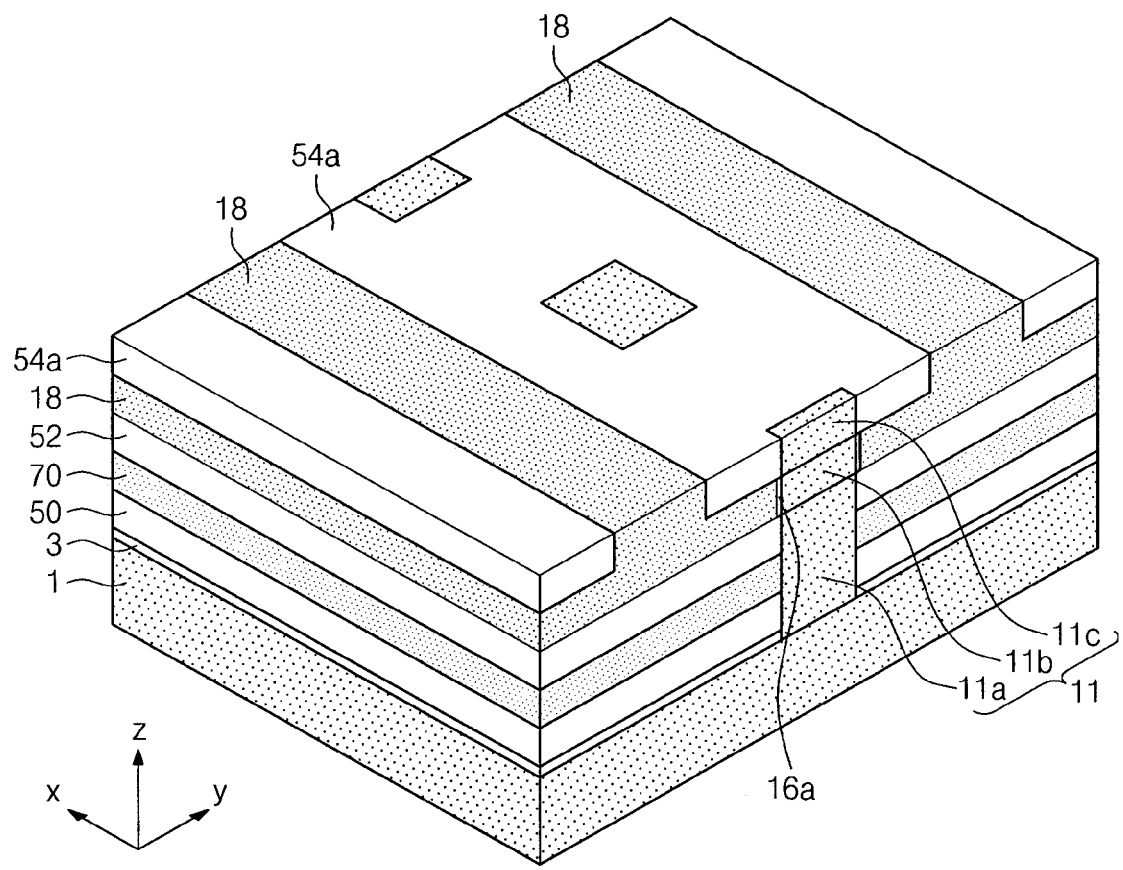

Referring to FIG. 12, a gate layer 18 may be formed on the semiconductor substrate 1, e.g., an entire surface of the semiconductor substrate 1 where the gate insulator 16a is formed. For example, the gate layer 18 may be formed in the region 14, e.g., the entire region 14, which may have been defined by the removal of the sacrificial layer 72. More particularly, the gate layer 18 may be formed to fill both the region 14 and the first groove 13. The gate layer 18 may include, e.g., metal, metal silicide, doped polysilicon and/or undoped polysilicon. The gate layer 18 may be formed using, e.g., chemical vapor deposition (CVD) and/or atomic layer deposition (ALD) providing better step coverage, etc. Furthermore, the gate layer 18 may be formed on the third insulating pattern 54a. Portions of the gate layer 18 formed on the third gate insulating pattern 54a may be removed using, e.g., a planarization process such as etchback or CMP.

Figure 13:
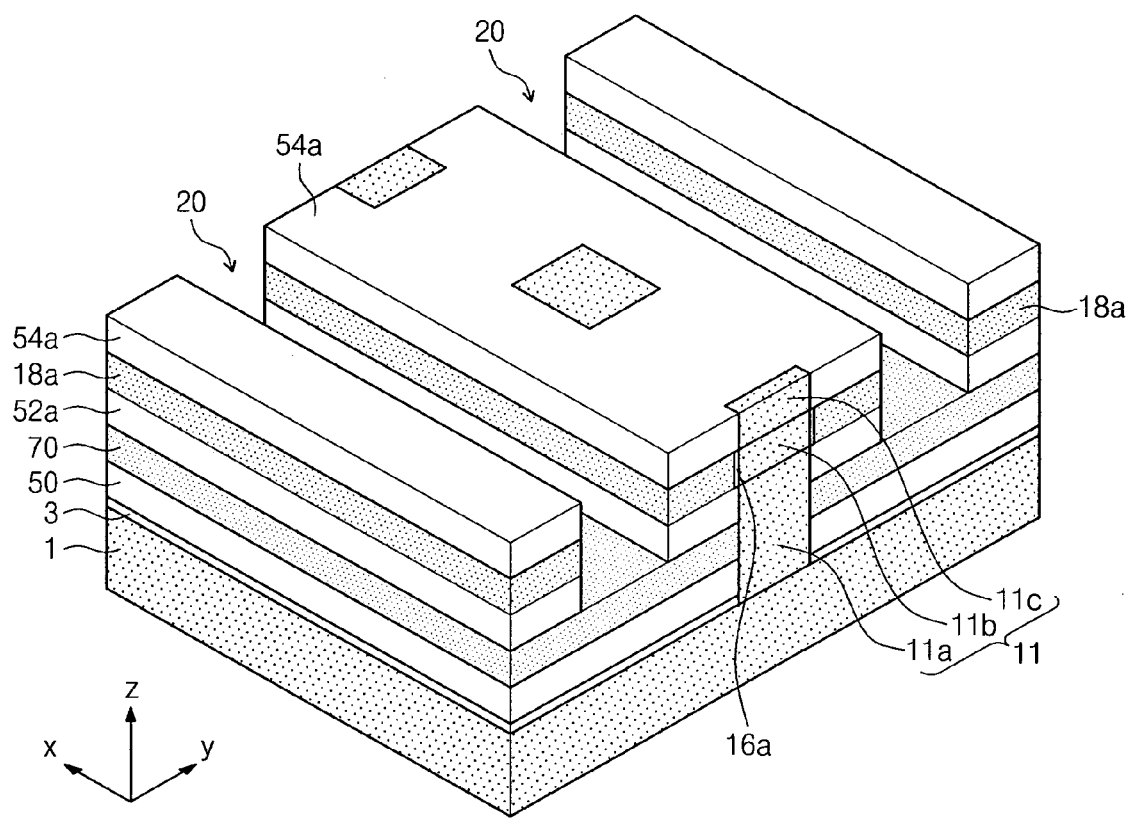

Referring to FIG. 13, the gate layer 18 and the second insulating layer 52 may be successively patterned at a position overlapping the first groove 13 to form a second groove 20. The second groove 20 may expose the first sacrificial layer 70. Thus, the gate pattern 18a and the second insulating pattern 52a may be formed so as to overlap the third insulating pattern 54a. The gate pattern 18a and the second insulating pattern 52a may have a same shape as the third insulating pattern 54a.

Figure 14:
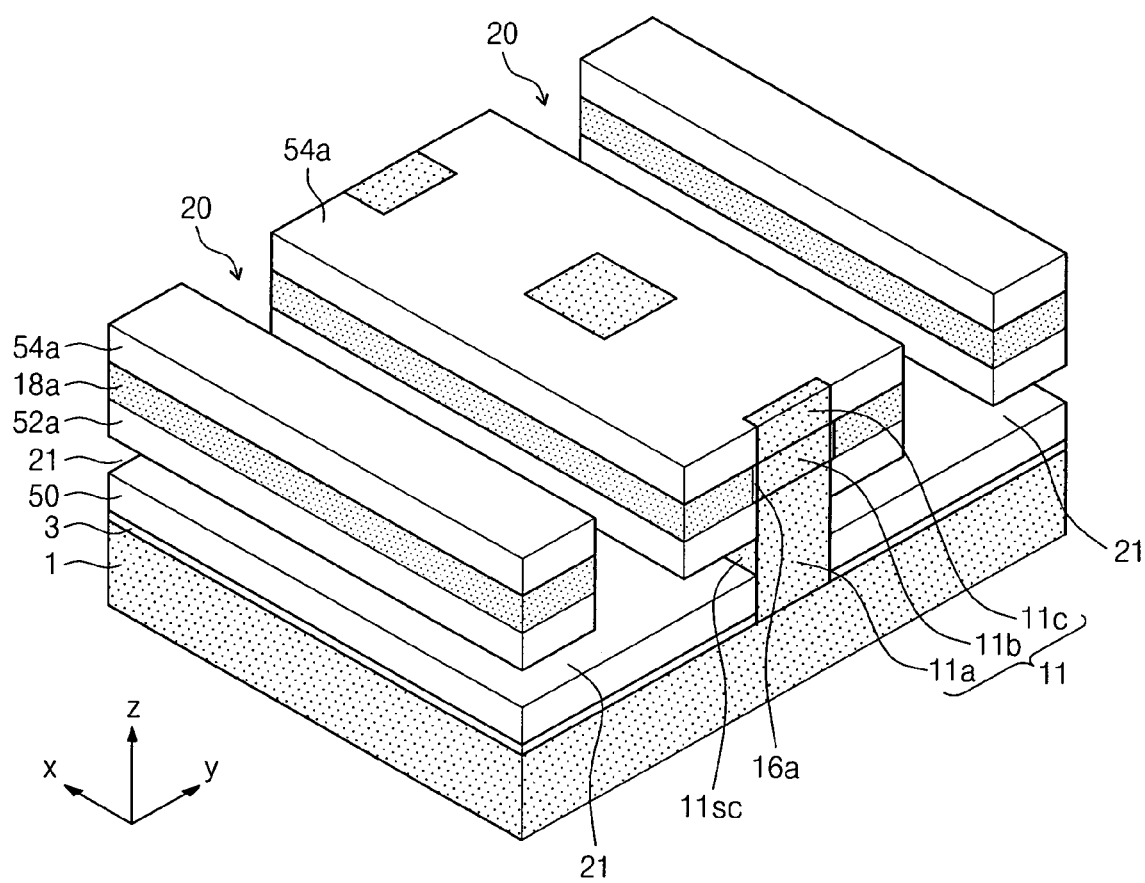

Referring to FIG. 14, the first sacrificial layer 70 exposed by the second groove 20 may be removed using, e.g., a wet etch. The first sacrificial layer 70 may be removed using a same and/or different process as the process employed to remove the second sacrificial layer 72. Due to removal of the first sacrificial layer 70, a sidewall 11sc of the first region 11a of the active pillar 11 may be exposed to a region 21. The region 21 may correspond to the region from which the first sacrificial layer 70 is removed.

Figure 15:
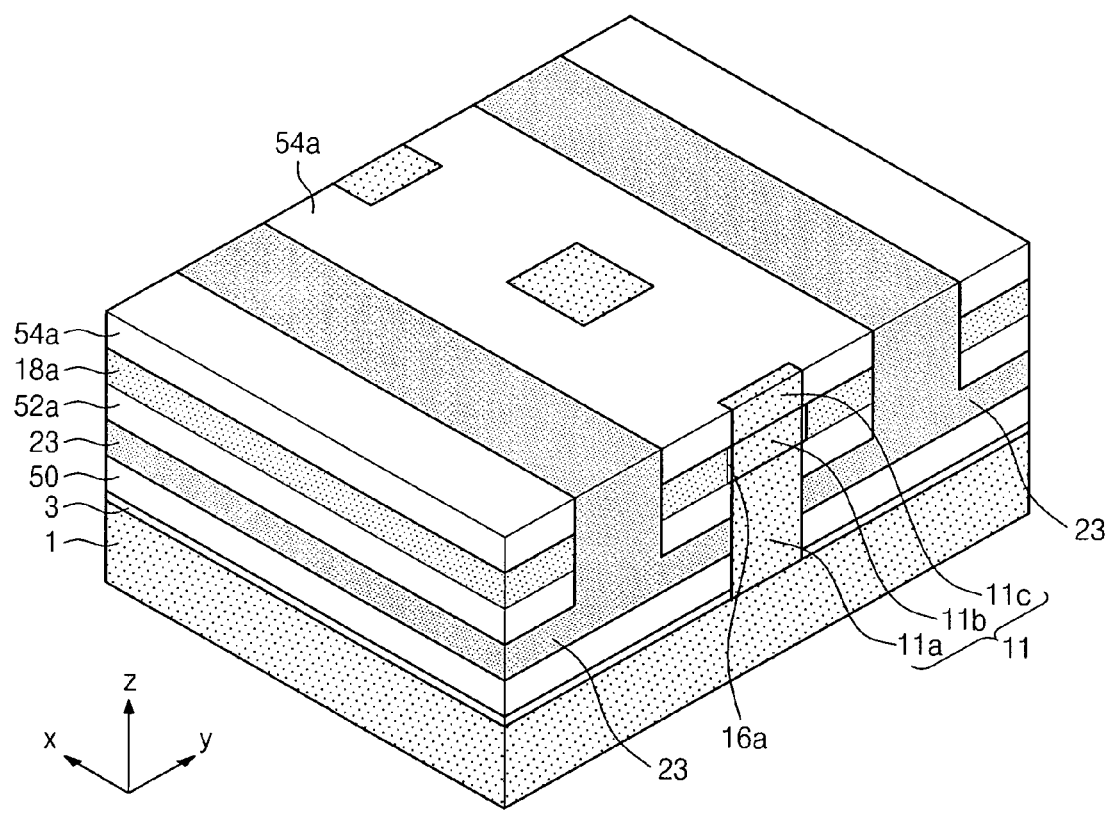

Referring to FIG. 15, a conductive pattern layer 23 may be formed on the semiconductor substrate 1. More particularly, the conductive pattern layer 23 may be formed, e.g., on an entire surface of the semiconductor substrate 1 where the sidewall 11sc of the source region 11c is exposed. For example, the conductive pattern layer 23 may be formed in the region 21, e.g., the entire region 21, which may have been defined by the removal of the sacrificial layer 70. More particularly, the conductive pattern layer 23 may be formed to fill both the region 21 and the second groove 20. The conductive pattern layer 23 may be formed by a similar manner to the gate layer 18. The conductive pattern layer 23 may include, e.g., metal, metal silicide, doped polysilicon, and/or undoped polysilicon. The conductive pattern layer 23 may also be formed on the third insulating pattern 54a. Portions of the conductive pattern layer 23 formed on the third insulating pattern 54a may be removed using, e.g., a planarization process.

Figure 16:
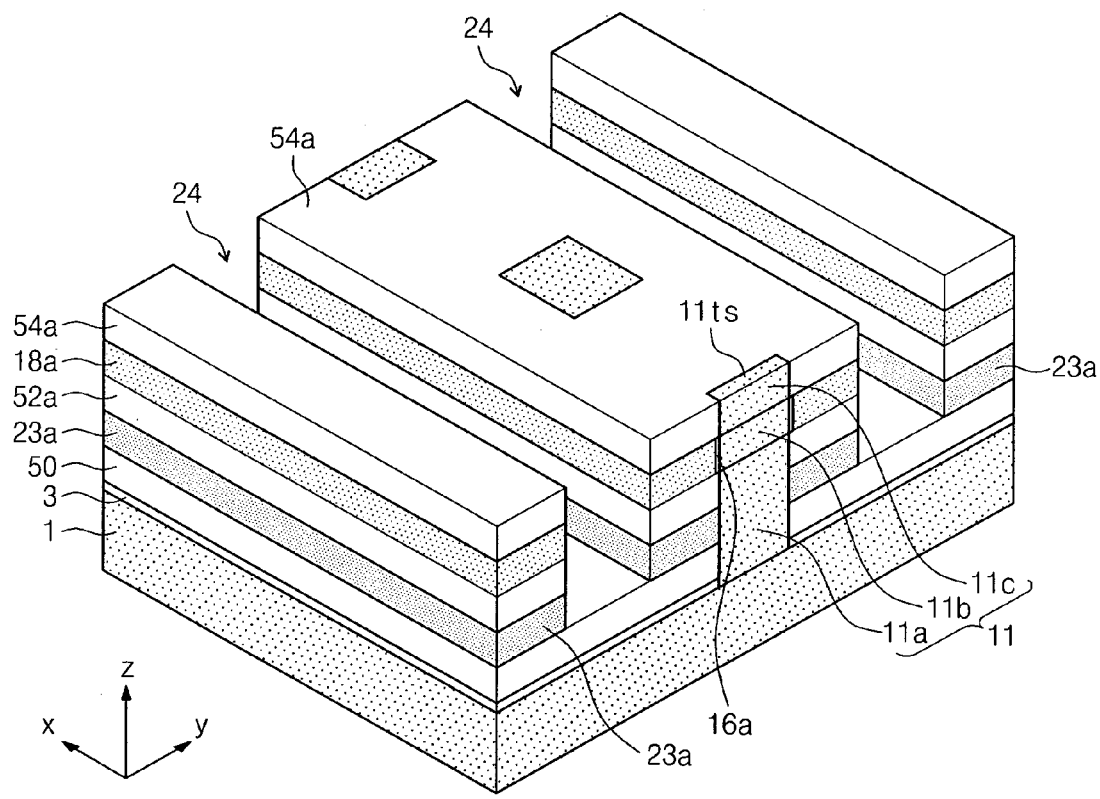

Referring to FIG. 16, the conductive pattern layer 23 may be removed at a position overlapping the second groove 20 to form a third groove 24 and to define the conductive pattern 23a. The third groove 24 may expose the first insulating layer 50.

Returning to FIG. 1, the insulating pattern 25 may be formed in the third groove 24. For formation of the insulating pattern 25, an insulating layer may be formed on the semiconductor substrate 1, e.g., on the entire surface of the semiconductor substrate 1 and then planarized to expose a top surface 11ts of the active pillar 11.

Figure 17:
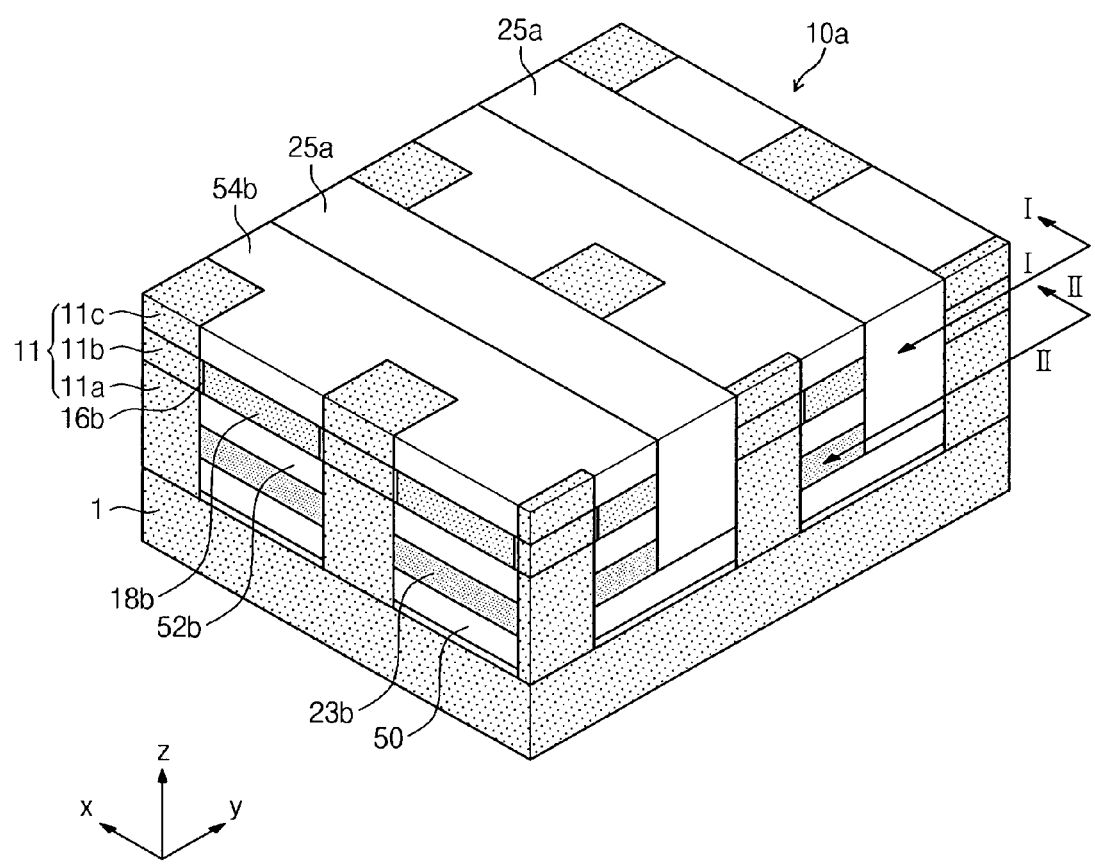
FIG. 17 illustrates a perspective view of another exemplary embodiment of a semiconductor memory device.
Figure 18A:
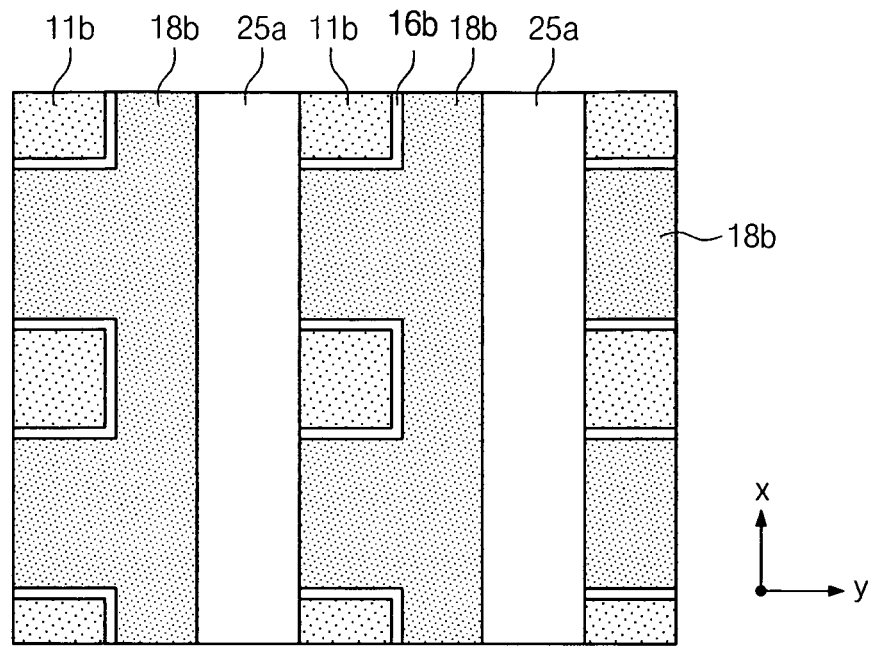
FIG. 18A illustrates a top plan view of the semiconductor memory device of FIG. 17, along the line I-I of FIG. 17.
Figure 18B:
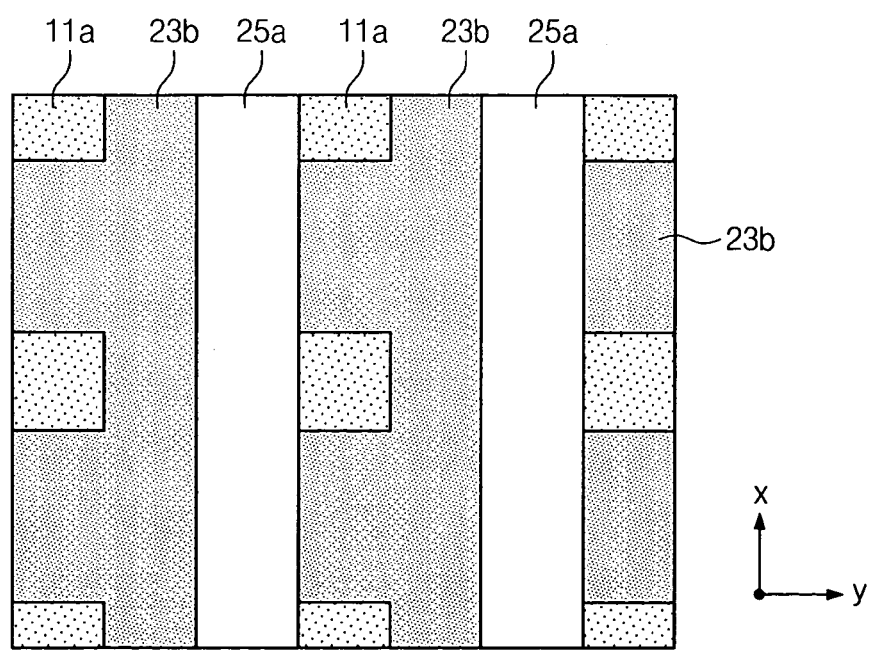
FIG. 18B illustrates a top plan view of the semiconductor memory device of FIG. 17, along the line II-II of FIG. 17.

FIG. 17 illustrates a perspective view of another exemplary embodiment of a semiconductor memory device 10a. FIG. 18A illustrates a top plan view of the semiconductor memory device 10a of FIG. 17, along the line I-I of FIG. 17. FIG. 18B illustrates a top plan view of the semiconductor memory device 10a of FIG. 17, along the line II-II of FIG. 17. In general, only differences between the exemplary semiconductor memory device 10 of FIGS. 1, 2A, and 2B, and the exemplary semiconductor memory device 10a of FIGS. 17, 18A, and 18B will be described below.

Referring to FIGS. 17, 18A, and 18B, the semiconductor memory device may include a gate pattern 18b, a gate insulator 16b, a conductive pattern 23b, and an insulating pattern 25a. Referring to FIGS. 17, 18A, and 18B, in some embodiments, the gate pattern 18b, the gate insulator 16b, and/or the conductive pattern 23b may only partially surround a respective portion of the active pillar 11. More particularly, e.g., in some embodiments, the gate pattern 18b, the gate insulator 16b and/or the conductive pattern 23b may only partially surround a respective portion of the active pillar 11 along, e.g., an x-y plane. With particular regard to the exemplary embodiment of FIGS. 17, 18A and 18B, if an active pillar 11 has four successive side surfaces, e.g., a square or rectangular shape, the gate pattern 18b and the conductive pattern 23b may overlap portions of, e.g., three or less side surfaces of the active pillar 11. For example, as shown in the exemplary embodiment of FIGS. 17, 18A, and 18B, at least portions of the gate pattern 18b, the conductive pattern 23b, and/or the gate insulator 16b may have a comb-like or U-like shape so as to be adjacent to three side surfaces of the active pillar 11. The gate pattern 18b and the conductive pattern 23b may generally extend along one direction, e.g., x-direction. In such embodiments, a side surface, e.g., vertical side surface extending along an x-z and/or y-z plane of the active pillar 11, may contact another layer. For example, in the exemplary embodiment of FIGS. 17, 18A, and 18B, among the side surfaces of the active pillar 11, the side surface of the active pillar 17, which is not in contact with the gate pattern 18b and/or the conductive pattern 23b, may be in contact with the insulating pattern 25a. In some embodiments, a portion of the gate pattern 18 corresponding to a single transistor may have the shape of tri-gate or omega. A third insulating pattern 54b and a second insulating pattern 52b may each have a similar shape to the conductive pattern 23b. The other elements may have features identical to those described with regard to FIG. 1.

When a unit transistor the semiconductor memory device 10a operates, extra holes or electrons may not be released to a semiconductor substrate 1, but may temporarily accumulate at a portion of the semiconductor device adjacent to the insulating pattern 25a in the body region 11b. The exemplary circuit diagram of FIG. 4 may also correspond to the exemplary embodiment of the semiconductor device of FIGS. 17, 18A, and 18B.

Figure 19:
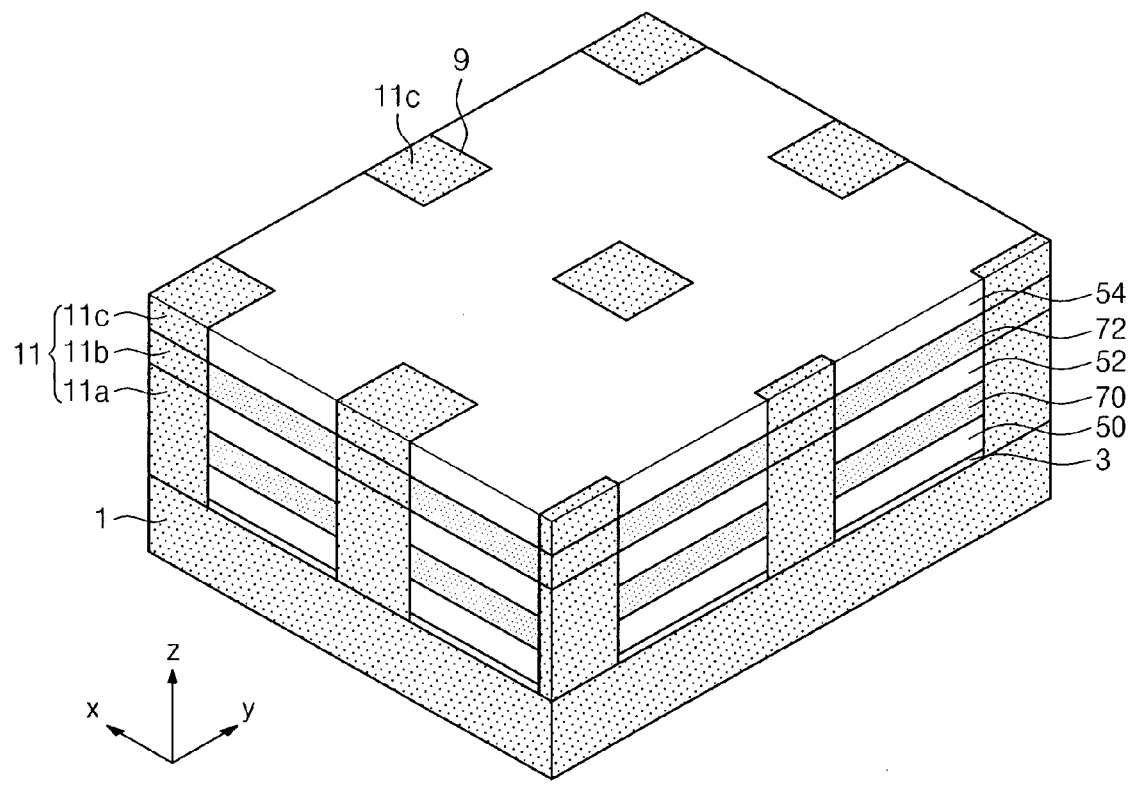
FIGS. 19, 20, and 21 illustrate perspective views of stages in an exemplary method of manufacturing the semiconductor memory device of FIG. 17.
Figure 20:
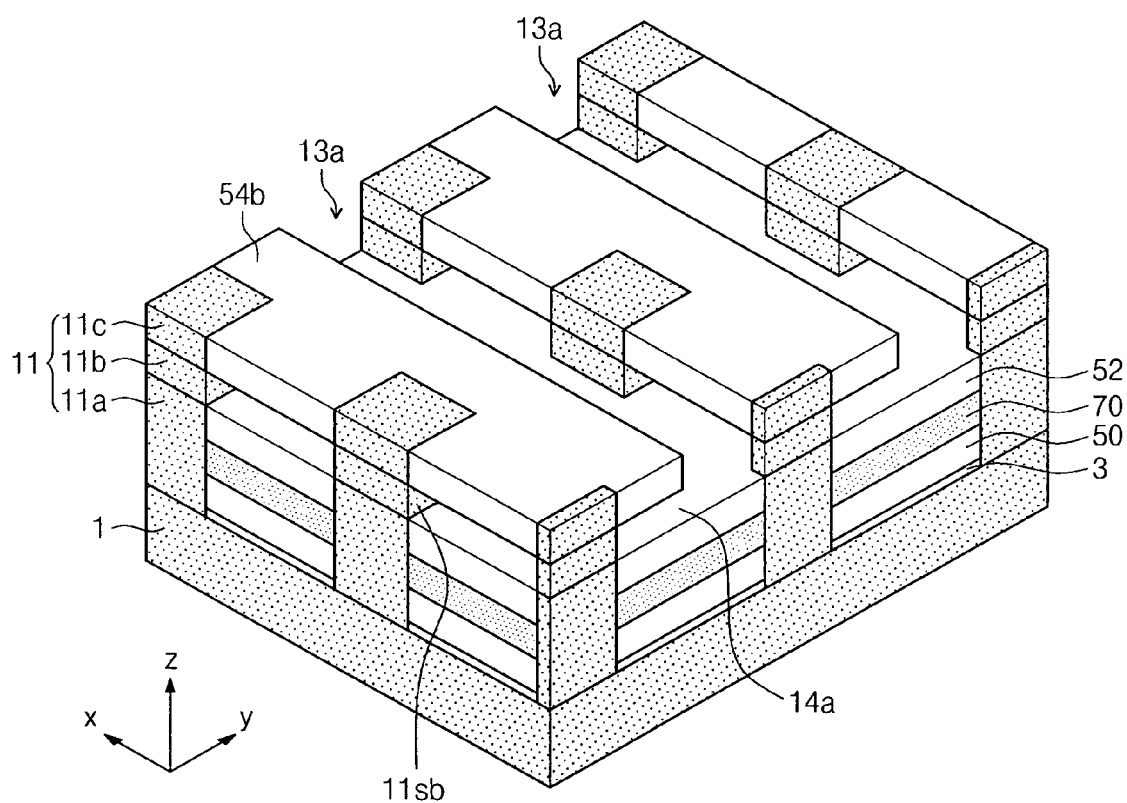
Figure 21:
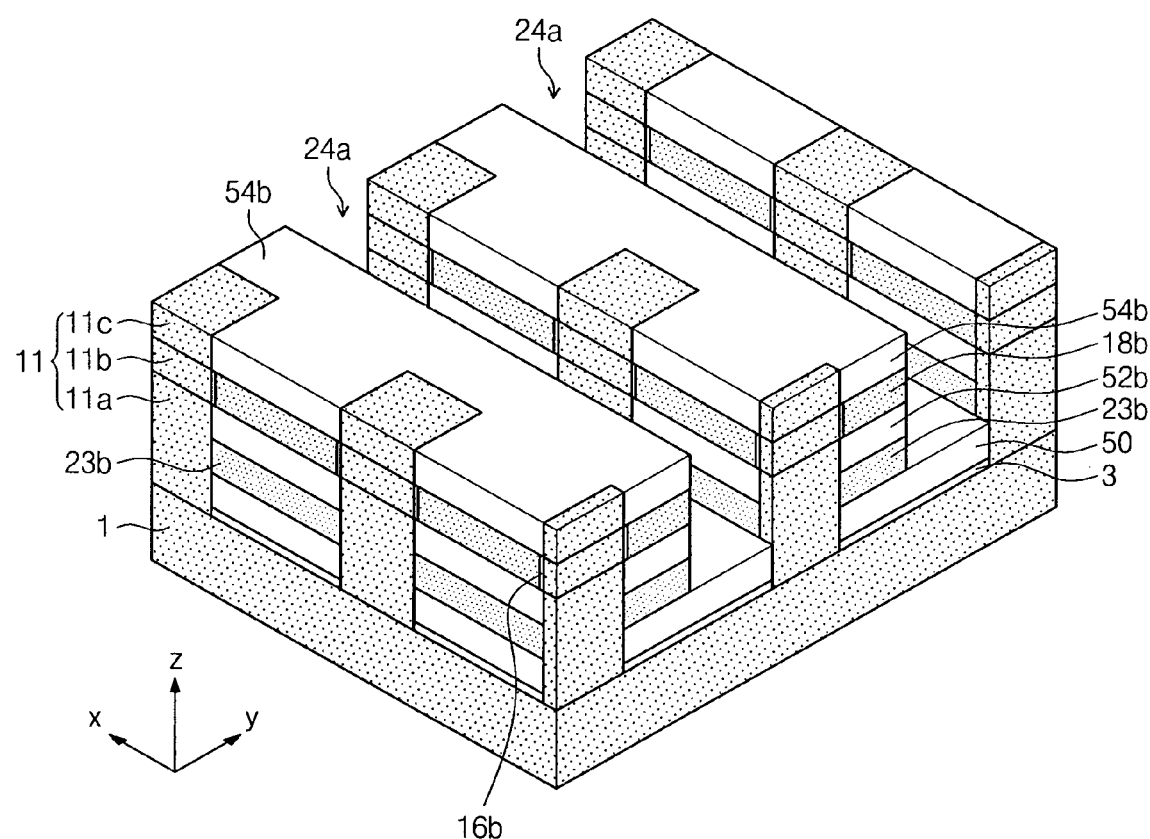

FIGS. 19, 20, and 21 illustrate perspective views of stages in an exemplary method of manufacturing the semiconductor memory device 10a of FIG. 17. In general, only differences between the exemplary embodiment of the method of manufacturing the semiconductor memory device 10a of FIGS. 19, 20 and 21 and the exemplary embodiment of the method of manufacturing the semiconductor memory device 10 of FIGS. 5, 6, 7, 8, 9, 10, 11, 12, 13, 14, 15, and 16 will be described below.

Referring to FIG. 19, similar to FIG. 6, insulating layers 3, 50, 52, and 54 and sacrificial layers 70 and 72 may be stacked on a semiconductor substrate 1 and then patterned to form the pillar hole 9, which may expose the semiconductor substrate 1. The active pillar 11 including the source region 11a, the body region 11b, and the drain region 11c may be formed in the pillar hole 9. The active pillar 11 may be formed through the same procedure as illustrated in FIG. 8. Note that the number of active pillars 11 formed per unit area may be larger than and/or smaller than that illustrated in FIG. 8.

Referring to FIG. 20, the third insulating layer 54 may be linearly etched to form a first groove 13a. The first groove 13a may expose the second sacrificial layer 72. At this point, the first groove 13a may be formed to expose one sidewall of the drain region 11c. The second sacrificial layer 72 exposed through a first groove 13a may be removed using, e.g., a selective wet etch. Sidewalls 11sb of the body region 11b may be exposed through a region 14a where the second sacrificial layer 72 is removed.

Referring to FIG. 21, a gate insulator 16b may be formed on the exposed sidewall 11sb of the body region 11b. A gate layer (not shown, see gate layer 18 of FIG. 12) may be formed in the region 14a, e.g., the entire region 14a, which may have been defined by the removal of the sacrificial layer 72. More particularly, the gate layer may be formed to fill both the region 14a and the first groove 13a. The gate layer and the second insulating layer 52 (FIG. 20) may be patterned at a position overlapping the first groove 13a to form a second groove (not shown), which exposes the first sacrificial layer 70 and to define the gate pattern 18b at the same time and/or same process. The gate pattern 18b may include a portion having a shape corresponding to, e.g., a partial cross-sectional shape of the active pillar 11, e.g., cross-sectional shape of the active pillar 11 along x-y plane. In the exemplary embodiment of FIG. 21, the gate pattern 18b has a comb-like or U-like shape. The first sacrificial layer 70 may be removed using, e.g., a selective wet etch and a second line layer may be formed to fill the second groove. The conductive line layer may be patterned at a position overlapping the second groove to form a third groove 24a, which may expose the first insulating layer 50, and the conductive pattern 23b at the same time and/or same process. The conductive pattern 23b may include a portion having a shape corresponding to, e.g., a partial cross-sectional shape of the active pillar 11, e.g., cross-sectional shape of the active pillar 11 along x-y plane. In the exemplary embodiment of FIG. 21, the conductive pattern 23b has a comb-like or U-like shape.

Referring to FIG. 17, the insulating pattern 25a may be formed in the third groove 24a during a subsequent process.

Figure 22:
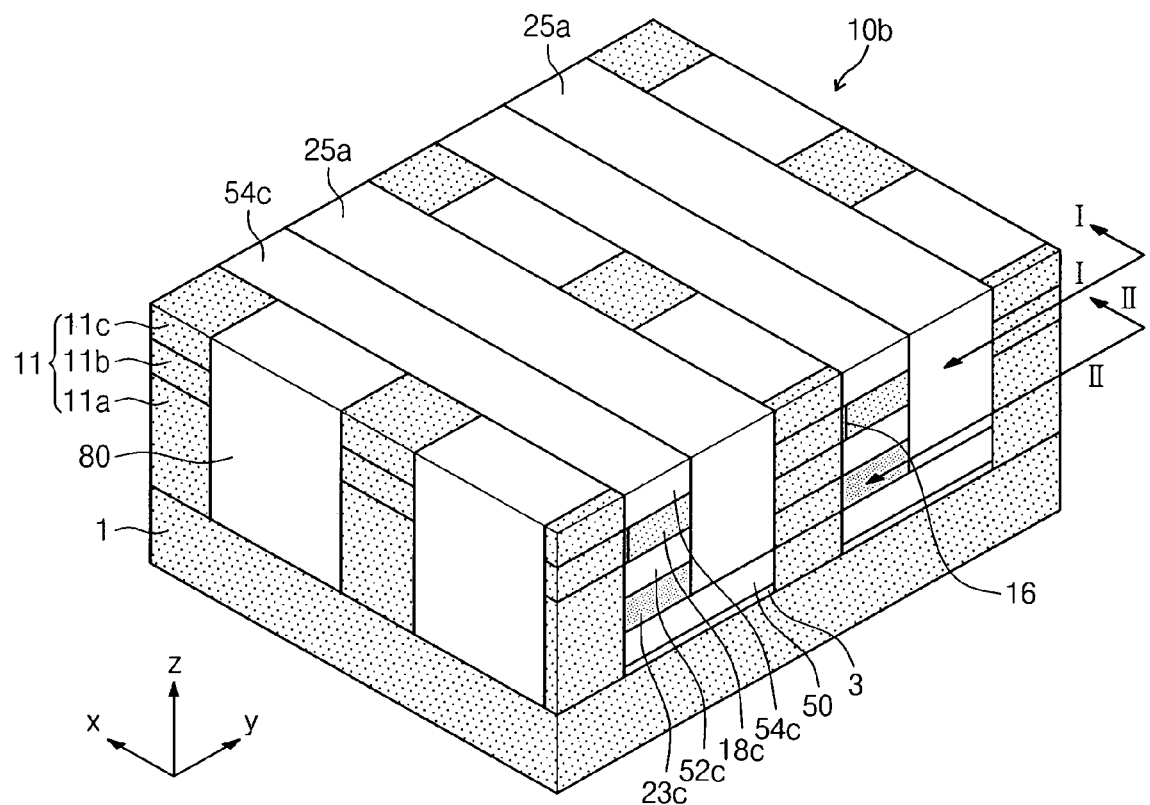
FIG. 22 illustrates a perspective view of another exemplary embodiment of a semiconductor memory device.
Figure 23A:
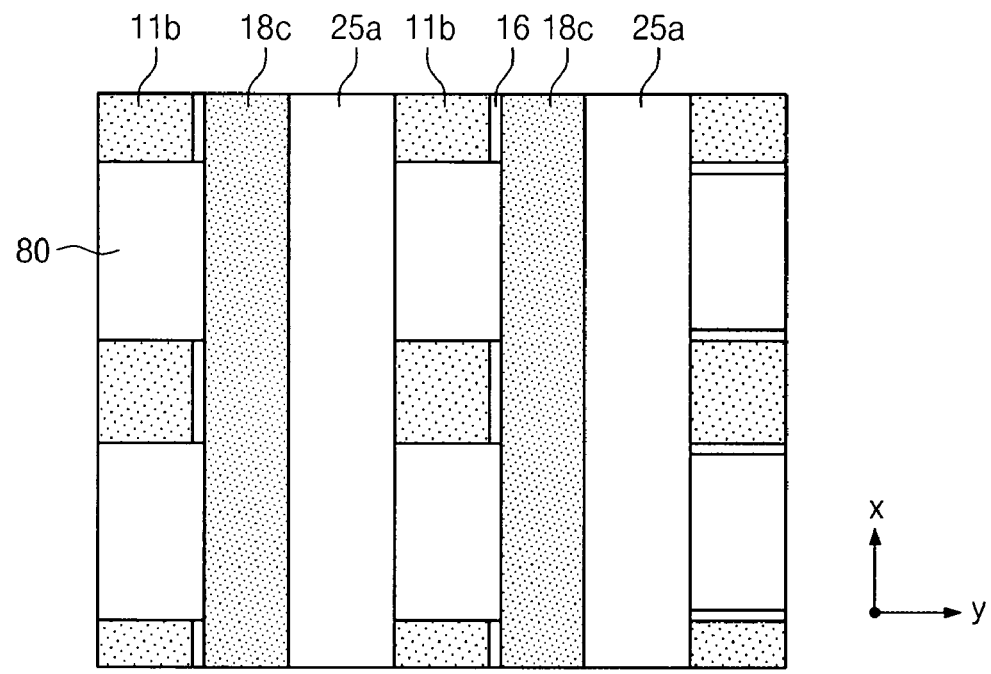
FIG. 23A illustrates a top plan view of the semiconductor memory device of FIG. 22, along the line I-I of FIG. 22.
Figure 23B:
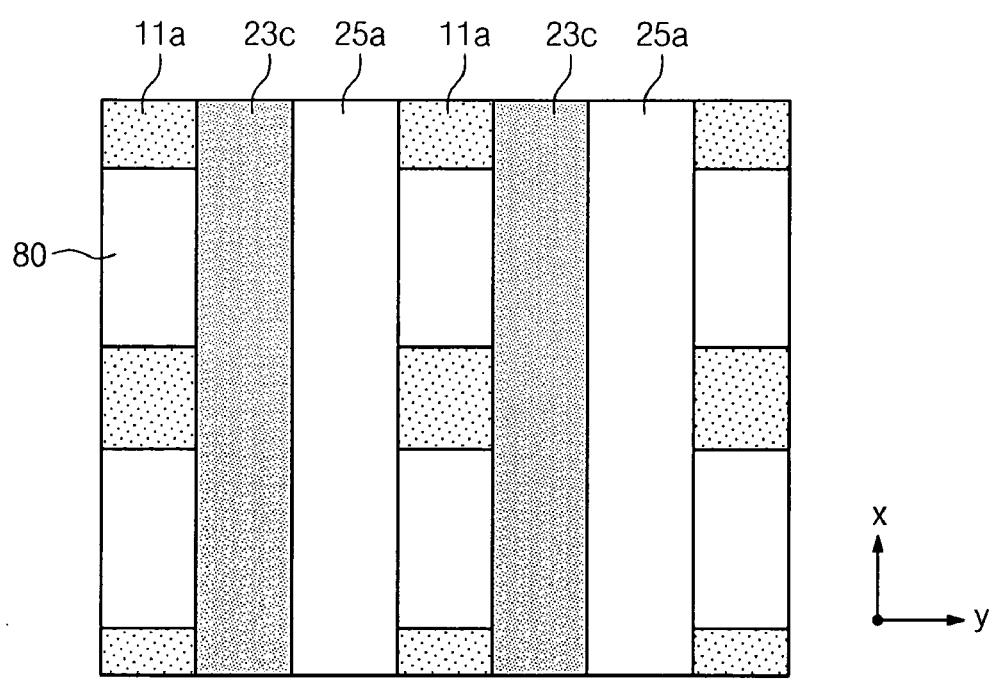
FIG. 23B illustrates a top plan view of the semiconductor memory device of FIG. 22, along the line II-II of FIG. 22.

FIG. 22 illustrates a perspective view of another exemplary embodiment of a semiconductor memory device 10b. FIG. 23A illustrates a top plan view of the semiconductor memory device 10b of FIG. 22, along the line I-I of FIG. 22. FIG. 23B illustrates a top plan view of the semiconductor memory device 10b of FIG. 22, along the line II-II of FIG. 22. In general, only differences between the exemplary semiconductor memory device 10a of FIGS. 17, 18A, and 18B, and the exemplary semiconductor memory device 10b of FIGS. 22, 23A, and 23B will be described below.

Referring to FIGS. 22, 23A, and 23B, the semiconductor memory device 10b may include a gate pattern 18c, a conductive pattern 23c, a third insulating pattern 54c, a second insulating pattern 52c, and an insulating pattern 80. The gate pattern 18c and the conductive pattern 23c may each have a shape that contacts only one side surface, e.g., a vertical side surface extending along an x-z and/or y-z plane, of the active pillar 11. For example, the gate pattern 18c and the conductive pattern 23c may have a shape of a line and may extend along one direction, e.g., x-direction.

The insulating pattern 80 may be disposed between adjacent ones of the active pillars 11. More particularly, the insulating pattern 80 may be disposed between adjacent ones of the active pillars 11 that may be aligned along one direction, e.g., x-direction. The gate pattern 18c and the conductive pattern 23c may be disposed between the insulating pattern 80 and the insulating pattern 25a. The third insulating pattern 54c and the second insulating pattern 52c each have a similar shape to the conductive pattern 23c. The other elements are identical to those in FIG. 17.

When a unit transistor the semiconductor memory device 10b operates, extra holes or electrons may not be released to a semiconductor substrate 1, but may temporarily accumulate at a portion of the semiconductor device adjacent to the insulating pattern 25a in the body region 11b. The exemplary circuit diagram of FIG. 4 may also correspond to the exemplary embodiment of the semiconductor device of FIGS. 22, 23A, and 23B. A circuit diagram of the semiconductor device according to this embodiment of the inventive concept may be illustrated in FIG. 4.

As another exemplary alternative (not shown) to the semiconductor memory device 10b of FIG. 22, two symmetrical gate patterns may be mutually shared with one active pillar interposed therebetween, while being insulated from each other. Similarly, in some embodiments, two adjacent conductive patterns may be mutually shared with one active pillar interposed therebetween.

FIGS. 24, 25, 26, and 27 illustrate perspective views of stages in an exemplary method of manufacturing the semiconductor memory device 10b of FIG. 22. In general, only differences between the exemplary embodiment of the method of manufacturing the semiconductor memory device 10b of FIGS. 24, 25, 26, and 27 and the exemplary embodiment of the method of manufacturing the semiconductor memory device 10a of FIGS. 19, 20, and 21 will be described below.

Figure 24:
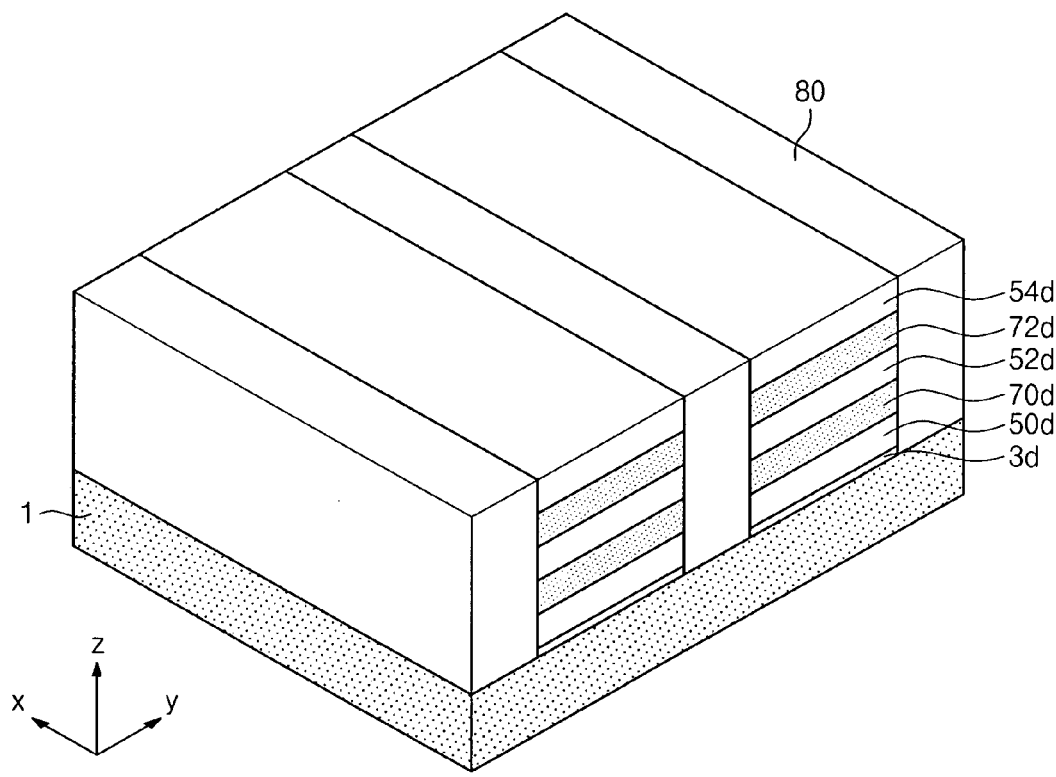
FIGS. 24, 25, 26, 27 illustrate perspective views of stages in an exemplary method of manufacturing the semiconductor memory device of FIG. 22.

Similar to FIGS. 6 and 24, insulating layers 3, 50, 52, and 54 and sacrificial layers 70 and 72 may be stacked on a semiconductor substrate 1 and then patterned to form a groove, e.g., line-shaped groove, which may expose the semiconductor substrate 1 and may define a peripheral circuit gate insulator 3d, a first insulating layer 50d, a first sacrificial layer 70d, a second insulating layer 52d, a second sacrificial layer 72d, and a third insulating layer 54d. Referring to FIG. 24, an insulating layer (not shown) may be formed in the groove and planarized to form the insulating pattern 80.

Figure 25:
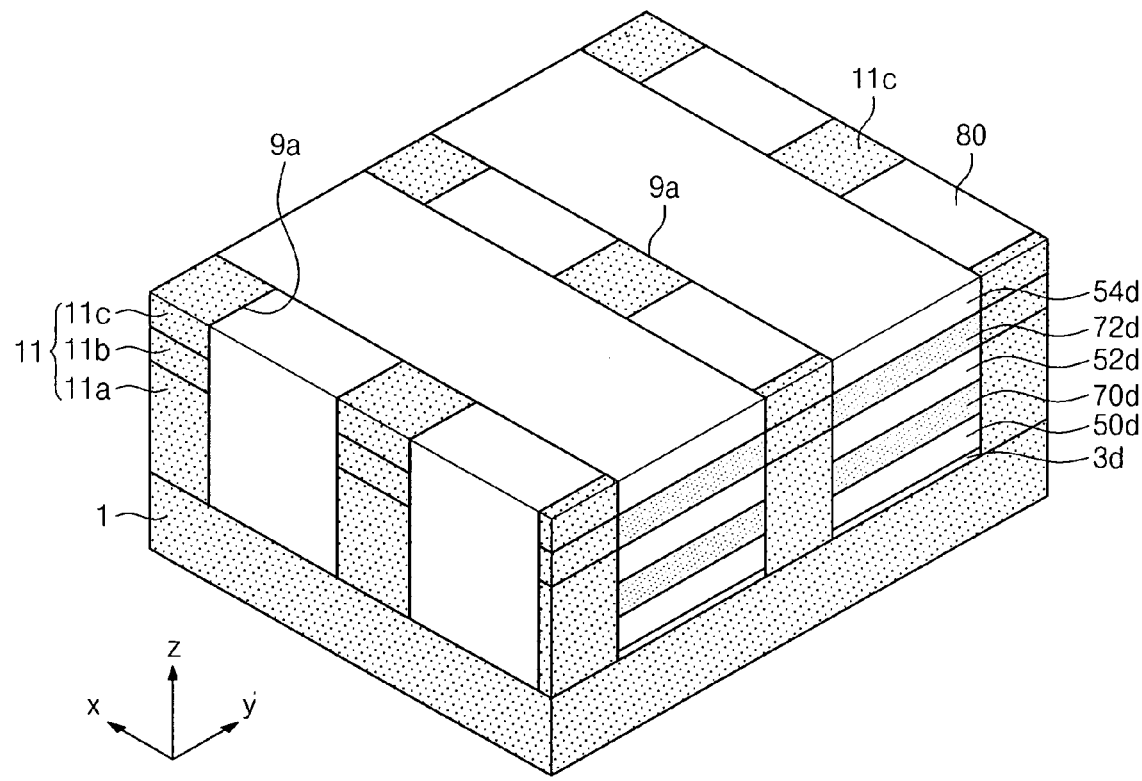

Referring to FIG. 25, the insulating pattern 80 may be patterned to form a pillar hole 9a, which may expose the semiconductor substrate 1, and within which the active pillar 11 may be formed. The insulating pattern 80 may be formed to extend along a same direction, e.g., x-direction, and/or to have a same general shape as the insulating pattern 25a that may be formed in a subsequent process. A position of the insulating pattern 80 may be different from that of the insulating pattern 25. For example, the insulating pattern 25a and the insulating pattern 80 may extend parallel to each other.

Figure 26:
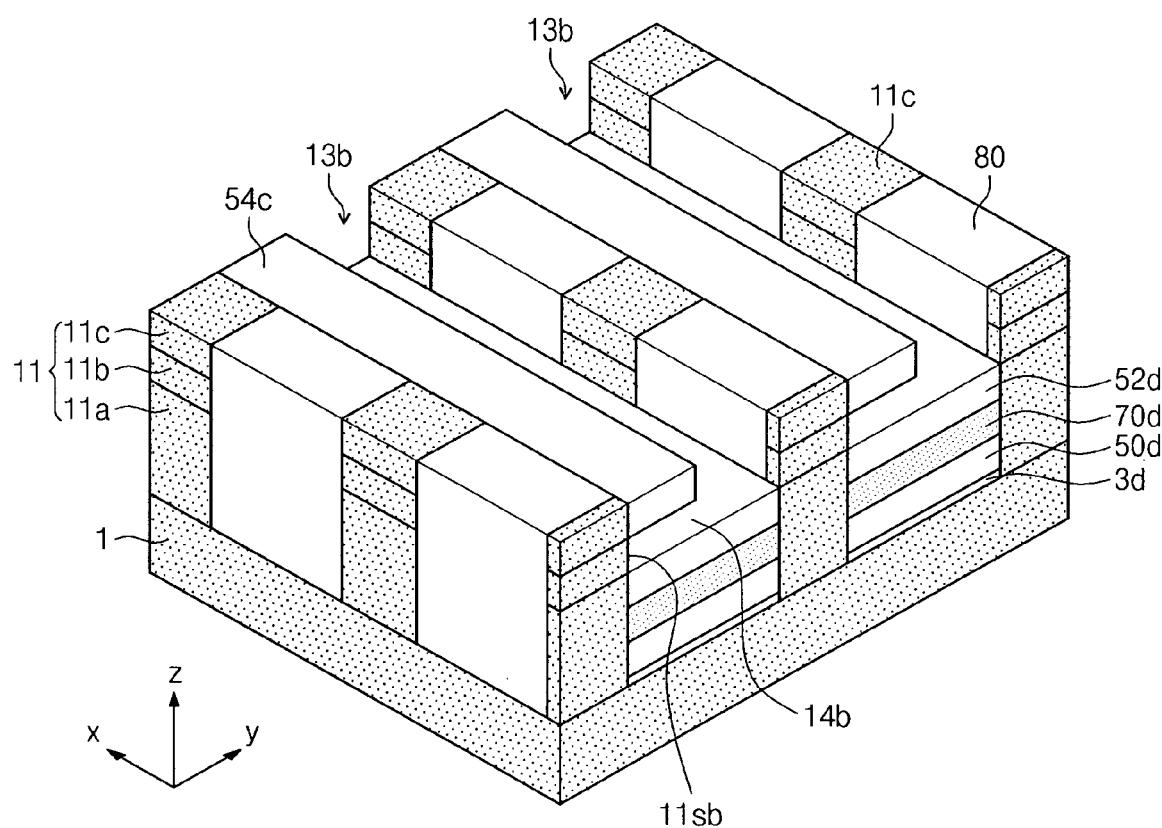

Referring to FIG. 26, the third insulating layer (not shown) may be linearly shaped to form a first groove 13b, which may expose the second sacrificial layer 72 and may define the third insulating pattern 54c. At this point, the first groove 13b may be formed to expose one sidewall 11bs of the body region 11b of the active pillar 11. The second sacrificial layer 72d exposed through the first groove 13b may be removed using, e.g., a selective wet etch. Sidewalls of the body region 11bs may be exposed through a region 14b, which may be defined by the removal of the second sacrificial layer 72d.

Figure 27:
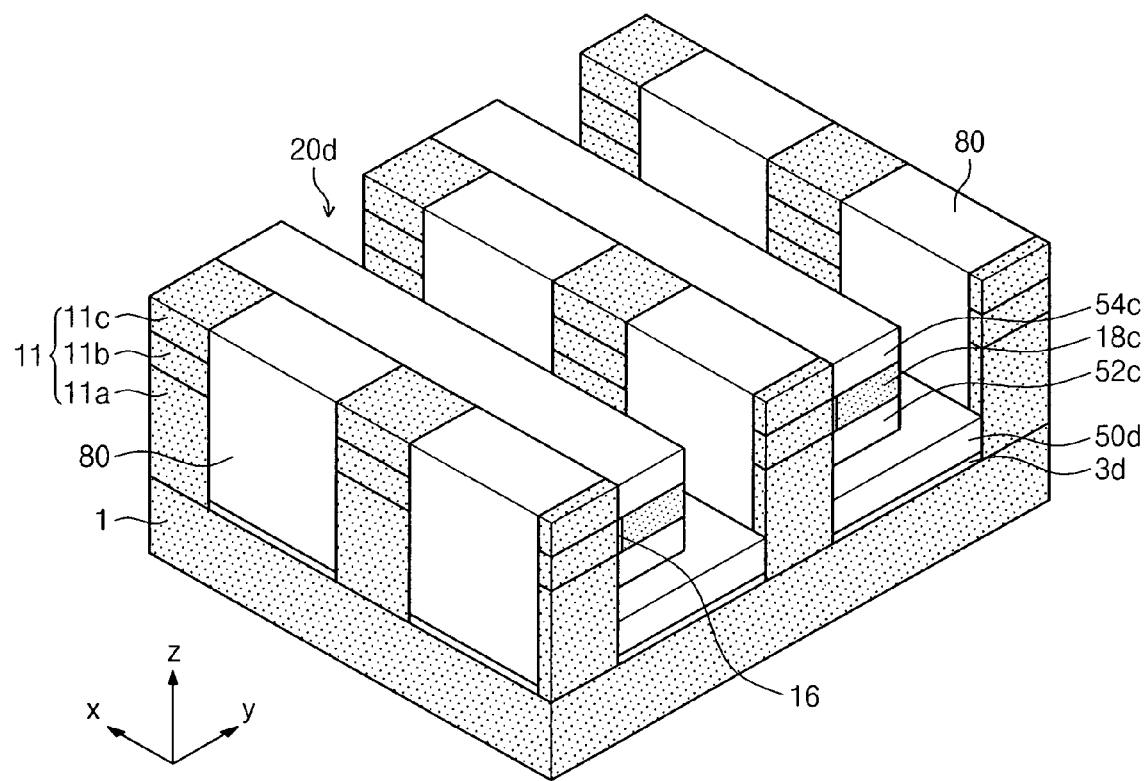

Referring to FIG. 27, a gate insulator 16d may be formed on the exposed sidewalls 11bs of the body region 11b. A gate layer (not shown, see gate layer 18 of FIG. 12) may be formed in the region 14b, e.g., the entire region 14b, which may have been defined by the removal of the sacrificial layer 72d. More particularly, the gate layer may be formed to fill both the region 14b and the first groove 13b. The gate layer and the second insulating layer 52d may be patterned at a position overlapping the first groove 13b to form a second groove (not shown), which may expose the first sacrificial layer 70d, and define a line-shaped gate pattern 18c at the same time. The first sacrificial layer 70d may be removed using, e.g., a selective wet etch.

Referring to FIGS. 22 and 27, a conductive pattern layer (not shown) may be formed in a subsequent process to fill the second groove. The conductive pattern layer may be patterned at a position overlapping the first groove 13d to form a third groove 20d, which may expose the first insulating layer 50, and may define a conductive pattern 23c, e.g., a line-shaped conductive pattern, at the same time. Moreover, as shown in FIG. 22, the insulating pattern 25a may be formed in the third groove 20d.

Figure 28:
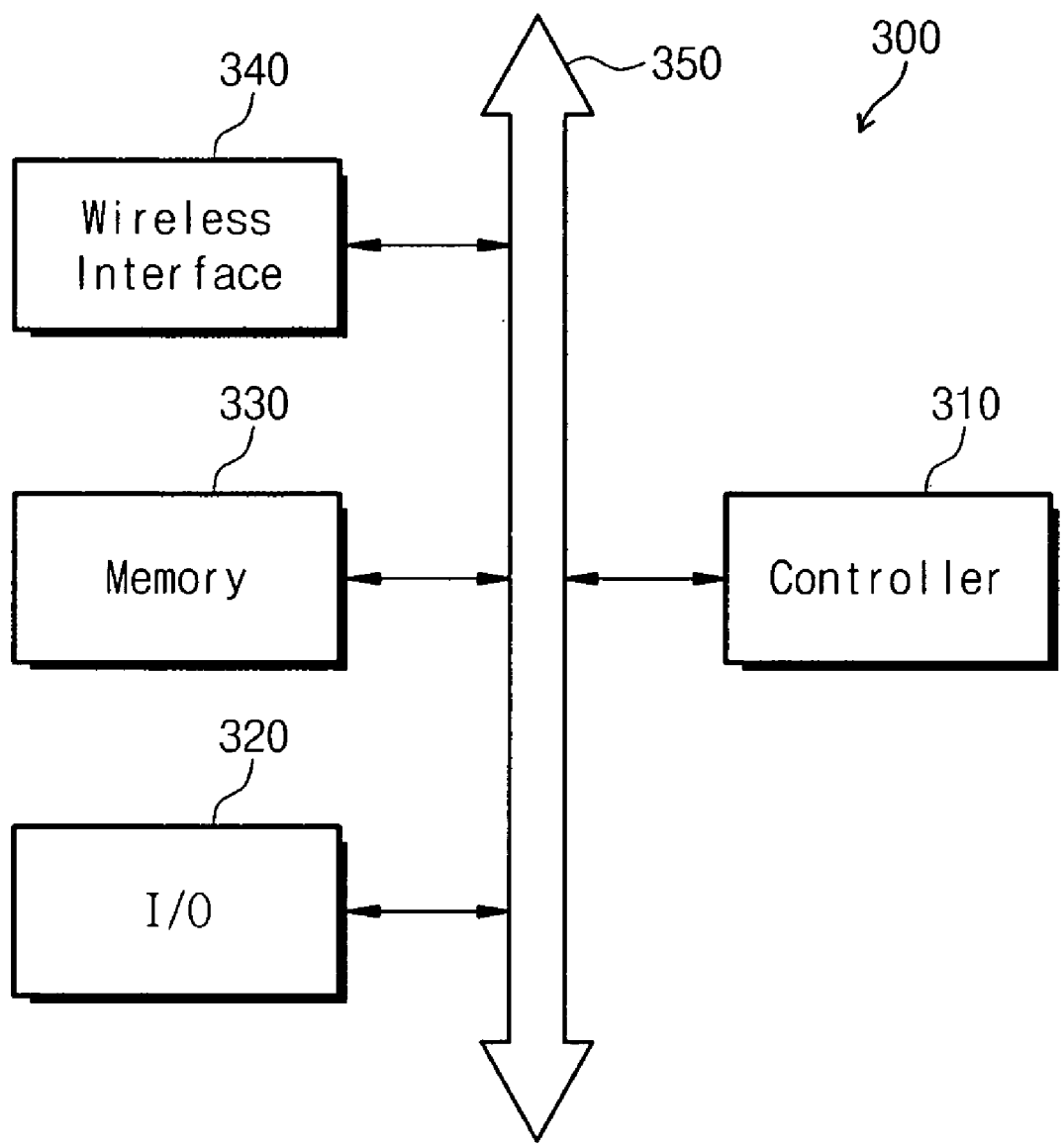
FIG. 28 illustrates a block diagram of an exemplary embodiment of an electronic system.

FIG. 28 illustrates a block diagram of an exemplary embodiment of an electronic system 300 including a semiconductor memory device, e.g., 10, 10a, 10b. The electronic system 300 may be used in wireless communication devices such as a personal digital assistant (PDA), a laptop computer, a portable computer, a web tablet, a wireless telephone, a cellular phone, a digital music player and/or all devices which can transmit and/or receive information in a wireless environment.

The electronic device 300 may include a controller 310, an input/output device (I/O) 320, a memory 330, and a wireless interface 340, which may be connected to each other through a bus 330. The controller 310 may include at least one microprocessor, at least one digital signal processor, at least one micro controller, etc. The memory 330 may be used to store, e.g., instructions executed by the controller 310. Also the memory 330 may be used to store user data. The memory 330 may include a semiconductor memory device, e.g., 10, 10a, 10b, employing one or more aspects of the exemplary embodiments described herein.

The electronic system 300 may use the wireless interface 340 to transmit/receive data to/from a wireless communication network, which may communicate using an RF signal. The wireless interface 340 may include, e.g., an antenna and a wireless transceiver.

The electronic system 300 may be used in a communication interface protocol of 3 G communication system, e.g., CDMA, GSM, NADC, E-TDMA, WCDMA, and CDMA2000.

Figure 29:
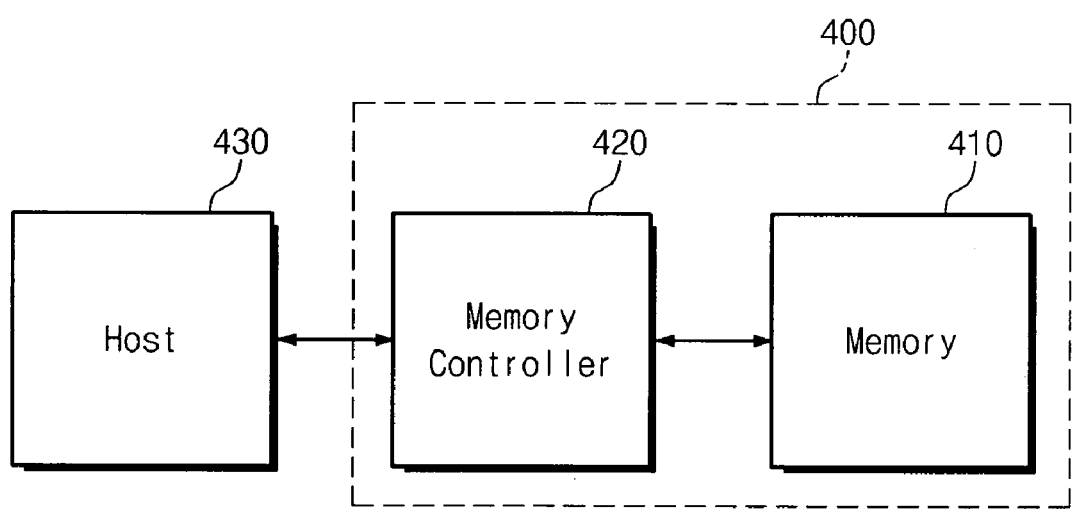
FIG. 29 illustrates a block diagram of an exemplary embodiment of a memory system.

FIG. 29 illustrates a block diagram of an exemplary embodiment of a memory system 400 including a semiconductor memory device, e.g., 10, 10a, 10b, employing one or more aspects of the exemplary embodiments described herein. The memory system 400 may include a memory device 410 configured to store high-capacity data and a memory controller 420. The memory controller 420 may control the memory device 410 such that stored data may be read from or written into the memory device 410 in response to a read/write request of a host 430. The memory controller 420 may include an address mapping table to map an address provided from the host 430, e.g., a mobile device or a computer system, into a physical address of the memory device 410. The memory device 410 may include a semiconductor memory device, e.g., 10, 10a, 10b, according to embodiments of the inventive concept.

A semiconductor memory device may include an active pillar projecting, e.g., perpendicularly, from a semiconductor substrate as an active region and may include a gate pattern contacting at least one side surface of the active pillar with a gate insulator interposed therebetween. Thus, embodiments may enable extra holes to be accumulated in a body region of the active pillar to embody a semiconductor memory device such as, e.g., a capacitorless DRAM device. Moreover, a short channel effect may be suppressed by adjusting vertical thickness of a gate pattern.

A semiconductor memory device employing one or more aspects of the exemplary embodiments described herein may include a conductive line, for applying a voltage to a source region, that is buried below a gate pattern such that an integration density to be improved.

Embodiments may provide a method of manufacturing a semiconductor device including forming an active pillar projecting from a semiconductor substrate without using a SOI substrate, which may be expensive, such that costs may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
    a plurality of active pillars projecting from a semiconductor substrate;
    a gate pattern disposed on at least a portion of each of the active pillars with a gate insulator interposed therebetween; and
    a conductive line disposed on each of the active pillars and below the corresponding gate pattern, the conductive line being insulated from the semiconductor substrate and the gate pattern, wherein each of the active pillars includes:
    a drain region above the corresponding gate pattern;
    a body region adjacent to the corresponding gate pattern; and
    a source region in contact with the conductive line below the gate pattern.

2. The semiconductor memory device as claimed in claim 1, wherein the gate pattern at least partially surrounds a plurality of the active pillars aligned along one direction.

3. The semiconductor memory device as claimed in claim 1, wherein the gate pattern completely surrounds at least a cross-sectional portion of the active pillars arranged therein.

4. The semiconductor memory device as claimed in claim 3, wherein the cross-sectional portion extends along a plane parallel to a plane along which the semiconductor substrate extends.

5. The semiconductor memory device as claimed in claim 1, wherein the gate pattern has a ladder-like shape including a plurality of openings within which corresponding ones of the active pillars are arranged.

6. The semiconductor memory device as claimed in claim 1, wherein the gate pattern has a comb-like shape defining a plurality of grooves within which the active pillars are arranged.

7. The semiconductor memory device as claimed in claim 1, wherein the active pillars have a columnar shape including four vertical sides, and the gate pattern is in contact with no more than three and no less than one vertical side of each of the corresponding ones of the active pillars.

8. The semiconductor memory device as claimed in claim 1, wherein the gate pattern has a linear shape and contacts one side surface of each of the corresponding ones of the active pillars.

9. The semiconductor memory device as claimed in claim 1, wherein the conductive line extends in a same direction as the gate pattern.

10. The semiconductor memory device as claimed in claim 1, wherein the conductive line has a same shape as the gate pattern.

11. The semiconductor memory device as claimed in claim 1, wherein the conductive line and the gate pattern completely overlap each other along a direction perpendicular to a plane along which the semiconductor substrate extends.

12. The semiconductor memory device as claimed in claim 1, further comprising an insulating pattern contacting a portion of the each of the active pillars free of the gate pattern, wherein at least a portion of each of the insulating pattern and the gate pattern contacting the active pillars extends along a same plane.

13. The semiconductor memory device as claimed in claim 12, wherein the insulating pattern extends along a same direction as a direction along which the active pillars extend.

14. The semiconductor memory device as claimed in claim 1, wherein the gate pattern extends along one direction.

* * * * *